(12) United States Patent
Wang

(10) Patent No.: US 7,755,125 B2
(45) Date of Patent: Jul. 13, 2010

(54) SEMICONDUCTOR DEVICE INCLUDING FERROELECTRIC CAPACITOR

(75) Inventor: Wensheng Wang, Kawasaki (JP)

(73) Assignee: Fujitsu Microelectronics Limited, Yokohama (JP)

(*) Notice: Subject to any disclaimer, the term of this patent is extended or adjusted under 35 U.S.C. 154(b) by 381 days.

(21) Appl. No.: 11/638,420

(22) Filed: Dec. 14, 2006

(65) Prior Publication Data

US 2008/0035970 A1     Feb. 14, 2008

(30) Foreign Application Priority Data

Aug. 10, 2006   (JP) ............................. 2006-218924

(51) Int. Cl.
*H01L 29/76* (2006.01)

(52) U.S. Cl. ................ 257/295; 257/306; 257/310; 257/E21.009; 257/E21.021; 257/E21.664; 257/E27.104; 438/3; 438/244; 438/387; 438/396

(58) Field of Classification Search ............... 257/295, 257/306, 310, E21.009, E21.021, E21.664, 257/E27.104; 438/3, 244, 387, 396
See application file for complete search history.

(56) References Cited

U.S. PATENT DOCUMENTS

| | | | | |
|---|---|---|---|---|
| 6,169,305 B1 * | 1/2001 | Takai et al. | ............ | 257/306 |
| 6,171,970 B1 * | 1/2001 | Xing et al. | ............ | 438/706 |
| 6,611,015 B2 * | 8/2003 | Ozaki et al. | ............ | 257/295 |
| 6,624,458 B2 * | 9/2003 | Takamatsu et al. | ............ | 257/295 |
| 6,627,496 B1 * | 9/2003 | Schindler et al. | ............ | 438/253 |
| 2006/0214204 A1 * | 9/2006 | Yoo et al. | ............ | 257/295 |

FOREIGN PATENT DOCUMENTS

| | | |
|---|---|---|
| JP | 2002-324894 A | 11/2002 |
| JP | 2003-174146 A | 6/2003 |
| JP | 2004-247324 A | 9/2004 |

* cited by examiner

*Primary Examiner*—Andy Huynh
(74) *Attorney, Agent, or Firm*—Westerman, Hattori, Daniels & Adrian, LLP

(57) ABSTRACT

A semiconductor device includes a ferroelectric capacitor formed above the lower interlevel insulating film covering a MOS transistor formed on a semiconductor substrate, including lamination of a lower electrode, an oxide ferroelectric film, a first upper electrode made of conductive oxide having a stoichiometric composition $AO_{x1}$ and an actual composition $AO_{x2}$, a second upper electrode made of conductive oxide having a stoichiometric composition $BO_{y1}$ and an actual composition $BO_{y2}$, where $y2/y1 > x2/x1$, and a third upper electrode having a composition containing metal of the platinum group; and a multilayer wiring structure formed above the lower ferroelectric capacitor, and including interlevel insulating films and wirings. Abnormal growth and oxygen vacancies can be prevented which may occur when the upper electrode of the ferroelectric capacitor is made of a conductive oxide film having a low oxidation degree and a conductive oxide film having a high oxidation degree.

8 Claims, 23 Drawing Sheets

Fig. 2E

| CONDUCTIVE OXIDE FILM | TEMP. | WORK GAS Ar : O₂ (Sccm) | HRBS RESULT x (IrOx) | |
|---|---|---|---|---|
| IrOx | 20°C | 100:52 | 1.20 | ⎫ M1-1 |
| IrOx | 20°C | 100:59 | 1.50 | ⎭ |
| IrOx | 300°C | 140:60 | 1.92 | E1 |
| IrOy | 20°C | 100:100 | 2.10 | ⎫ |
| IrOy | 300°C | 100:100 | 2.02 | E1 |
| IrOy | 300°C | 120:80 | 2.00 | ⎭ |
| IrOz | 300°C | 160:40 | 1.84 | E1 |

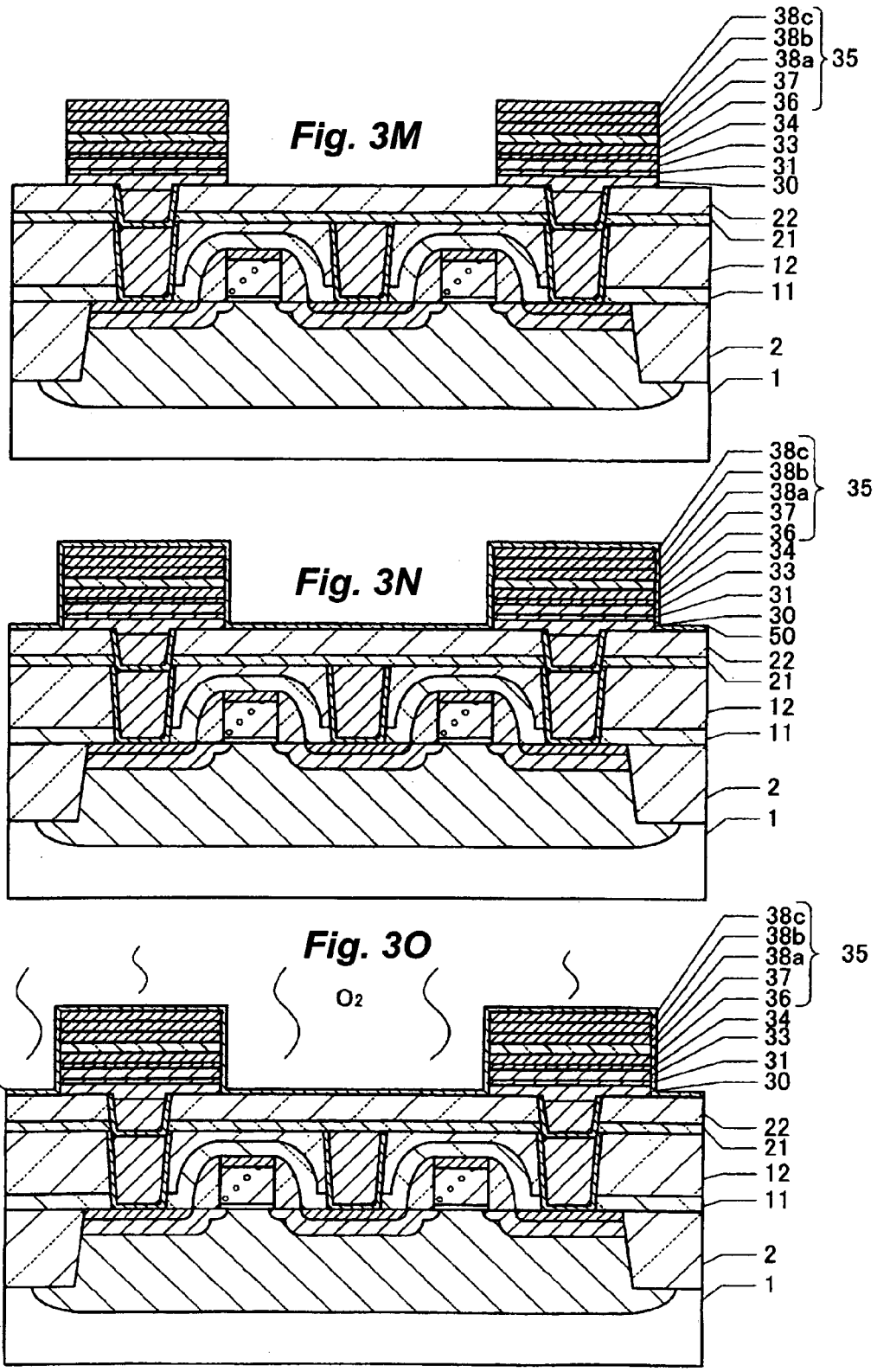

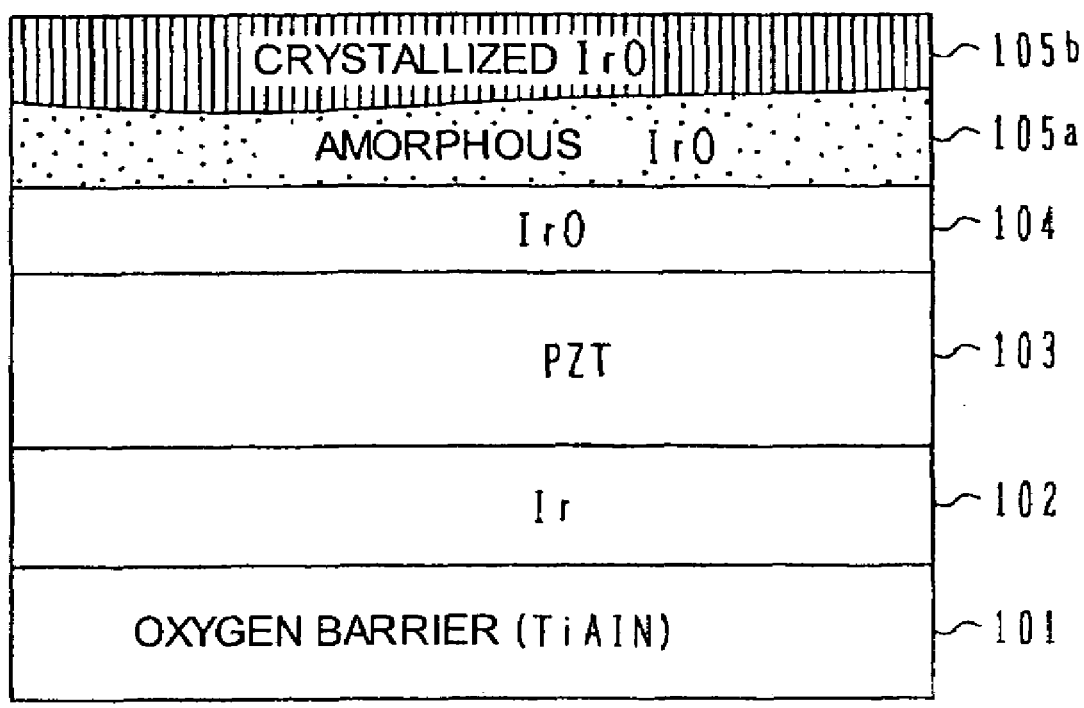

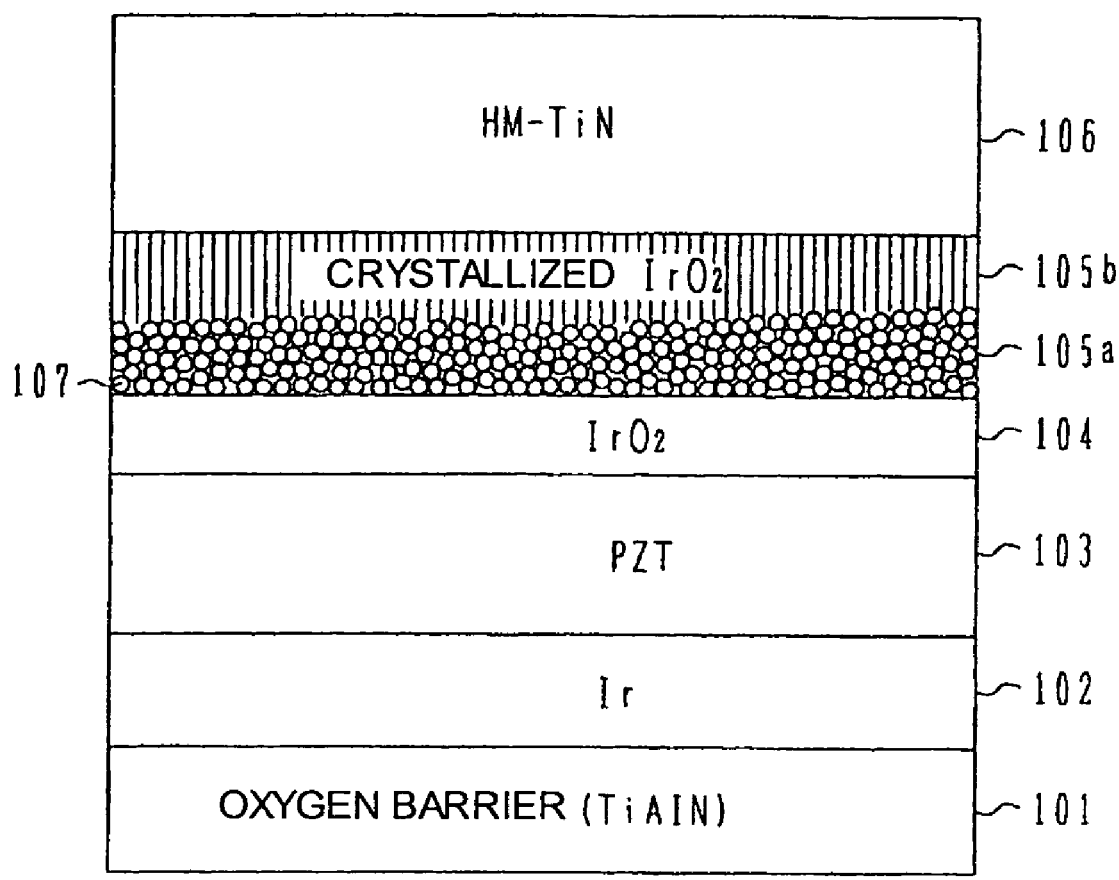

SEMICONDUCTOR DEVICE INCLUDING FERROELECTRIC CAPACITOR

CROSS REFERENCE TO RELATED APPLICATION

This application is based on and claims priority of Japanese Patent Application No. 2006-218924 filed on Aug. 10, 2006, the entire contents of which are incorporated herein by reference.

BACKGROUND OF THE INVENTION

A) Field of the Invention

The present invention relates to a semiconductor device and its manufacture method, and more particularly to a semiconductor device having ferroelectric capacitors and its manufacture method.

B) Description of the Related Art

With the recent development of digital technologies, there arise high demands for processing or storing a large amount of data at high speed. Therefore, semiconductor devices used in electronic apparatus are required to have high integration density and high performance. For example, in order to realize high integration density of dynamic random access memories (DRAMs), techniques are widely researched and developed by which a ferroelectric material film or a high dielectric constant material film is used as a capacitor dielectric film, in place of a silicon oxide film or a silicon nitride film.

Vigorous researches and developments have been conducted on a ferroelectric memory (FeRAM) using a ferroelectric material film having spontaneous polarization characteristics as a capacitor dielectric film, in order to realize a nonvolatile memory capable of data read/write at lower voltage and at high speed.

A ferroelectric memory stores information by utilizing hysteresis characteristics of a ferroelectric capacitor having a ferroelectric film sandwiched between a pair of electrodes. The ferroelectric film generates polarization corresponding to a voltage applied between the electrodes, and retains spontaneous polarization even if the applied voltage is removed. As the polarity of the applied voltage is reversed, the polarity of spontaneous polarization is also reversed. Information can be read by detecting spontaneous polarization. As compared to a flash memory, a ferroelectric memory operates at a lower voltage and can write data at high speed with reduced power dissipation.

A capacitor dielectric film of FeRAM is made of lead zirconate titanate (PZT), La-doped PZT (PLZT), PZT-containing material doped with Ca, Sr or Si slightly, Bi-containing layer structure compound such as $SrBi_2Ta_2O_9$ (SBT) and $SrBi_2(Ta, Nb)_2O_9$ (SBTN) or the like, and manufactured by a sol-gel method, sputtering, metal organic chemical vapor deposition (MOCVD) or the like.

Generally, an oxide ferroelectric film in an amorphous or micro crystal state is formed on a lower electrode by the above-described film forming method, and thereafter heat treatment is performed to change the crystal structure to a perovskite structure or a bismuth compound layer structure. Therefore, the lower electrode of a ferroelectric capacitor is made of platinum group metal such as platinum (Pt) and iridium (Ir) hard to be oxidized in an oxygen atmosphere, or platinum group conductive oxide such as iridium oxide ($IrO_x$). A ferroelectric film is likely to form oxygen vacancies by heat treatment in an oxygen atmosphere so that characteristics of the ferroelectric film are degraded, such as reduction in a switching charge and an increase in a leak current.

In manufacturing a ferroelectric capacitor, heat treatment in an oxygen atmosphere is required to be performed plural times in order to recover crystal defects such as oxygen vacancies. Therefore, the upper electrode of the ferroelectric capacitor is also made of platinum group metal such as Pt and Ir hard to be oxidized in an oxygen atmosphere, or conductive platinum group oxide such as $IrO_x$ and $RuO_x$. Various proposals have been made using a laminated electrode of a plurality of electrode layers.

JP-A-2003-174146 proposes that an upper electrode is made of a first oxide electrode and a second oxide electrode, one being made of SrRuO which contains Pb, Bi, Cu at 0.1 at % or more and the other being made of $IrO_x$.

JP-A-2004-247324 proposes that a PbRuO conductive layer is formed on a PZT film and a $RuO_2$ conductive layer is formed on the PbRuO conductive layer to form an upper electrode.

Also in FeRAM, there are high demands for miniaturization and low voltage operation in recent years. It is therefore required that a ferroelectric film constituting a ferroelectric capacitor has a sufficient switching charge quantity $Q_{SW}$ even in a miniaturized structure. If a multilayer wiring structure is adopted, there is a possibility that the characteristics of a ferroelectric capacitor are degraded by a reducing atmosphere process used by a multilayer wiring manufacture method.

If an upper electrode is made of a Pt film, an Ir film or the like, there is a non-negligible danger that hydrogen in a reducing atmosphere used by a process of forming an interlevel insulating film invades the Pt film or Ir film and is activated by a catalyst function of the metal film, and the activated hydrogen reduces the ferroelectric film. If the ferroelectric film is reduced, the operation characteristics of the ferroelectric capacitor are degraded considerably. This problem of degraded characteristics appears conspicuously particularly when the ferroelectric capacitor is made micro fine.

JP-A-2002-324894 (U.S. Pat. No. 3,661,850) proposes that a first upper electrode made of conductive oxide having a stoichiometric composition $AO_{x1}$ at a composition of $AO_{x2}$ is formed on a ferroelectric film, and a second upper electrode made of conductive oxide having a stoichiometric composition $AO_{y1}$ at a composition of $AO_{y2}$ is formed on the first upper electrode, where $y2/y1 > x2/x1$. Namely, an oxidation degree of the first upper electrode is suppressed to form a good interface with ferroelectric material, and the second upper electrode is made of conductive oxide having an increased oxidation degree to suppress generation of metal functioning as catalyst. $AO_{y2}$ has preferably a composition near the stoichiometric composition.

SUMMARY OF THE INVENTION

It has been found that a new problem occurs if the upper electrode of a ferroelectric capacitor is made of a first conductive oxide film having a suppressed oxidation degree and a second conductive oxide film having an increased oxidation degree. An object of the second conductive oxide film is to shield hydrogen and $H_2O$ (e.g., hydrogen and $H_2O$ invading when an interlevel insulating film is formed or when a W conductive layer is formed in a contact hole formed through the interlevel insulating film) invading from an upper region of the capacitor. In order to provide sufficient function, a thickness of the second conductive oxide film is required to be 100 nm or thicker. However, as the second conductive oxide film having a high oxidation degree becomes thick, abnormal growth is likely to occur. Namely, if a crystallized second conductive oxide film is formed thick, crystals are likely to grow abnormally on the surface of the film. Particularly when the film is formed at high temperature, the film having a thickness of 100 nm or thicker is likely to grow abnormally.

As will be described later, in order to solve this problem, the second conductive oxide film was formed just above the first conductive oxide film first at low temperature in an amorphous phase, thereafter a crystallized conductive oxide film was formed by changing a film forming power. This second conductive oxide film has an amorphous phase in a lower region, and an upper region is crystallized by a rise of the substrate temperature during film formation. Abnormal growth does not occur while this second conductive oxide film is formed. However, the following point has been found. The second conductive oxide film is very unstable oxide, and is crystallized if the substrate is heated in later processes or if heat treatment is performed. At the same time of crystallization, oxygen is removed from the second conductive oxide film, and oxygen vacancies are formed and a number of voids are formed in the film. Hydrogen and $H_2O$ invading from the upper region of the capacitor break the ferroelectric film via these voids, to degrade the electric characteristics of the capacitor. Film stripping is likely to occur during a multilayer wiring forming process.

An object of this invention is to provide a semiconductor device and its manufacture method capable of solving a newly found problem.

According to one aspect of the present invention, there is provided a semiconductor device comprising:

a semiconductor substrate;

a MOS transistor formed on the semiconductor substrate;

a lower interlevel insulating film covering the MOS transistor;

a ferroelectric capacitor formed above the lower interlevel insulating film comprising:

a capacitor lower electrode;

an oxide ferroelectric film formed on the capacitor lower electrode;

a first capacitor upper electrode formed on the oxide ferroelectric film and made of conductive oxide having a stoichiometric composition $AO_{x1}$ and an actual composition $AO_{x2}$;

a second capacitor upper electrode formed on the first capacitor upper electrode and made of conductive oxide having a stoichiometric composition $BO_{y1}$ and an actual composition $BO_{y2}$, where $y2/y1 > x2/x1$; and a third capacitor upper electrode formed on the second capacitor upper electrode and having a composition containing metal of the platinum group; and a multilayer wiring structure formed above the lower interlevel insulating film, covering the ferroelectric capacitor and including interlevel insulating films and wirings.

According to another aspect of the present invention, there is provided a method of manufacturing a semiconductor device, comprising the steps of:

(a) forming a MOS transistor on a semiconductor substrate;

(b) forming a lower interlevel insulating film on the semiconductor substrate, the lower interlevel insulating film covering the MOS transistor;

(c) forming a capacitor lower electrode above the lower interlevel insulating film;

(d) forming a capacitor dielectric film of oxide ferroelectric material on the capacitor lower electrode;

(e) forming a first capacitor upper electrode on the capacitor dielectric film, the first capacitor upper electrode being made of conductive oxide having a stoichiometric composition $AO_{x1}$ and an actual composition $AO_{x2}$;

(f) forming a second capacitor upper electrode on the first capacitor upper electrode, the second capacitor upper electrode being made of conductive oxide having a stoichiometric composition $BO_{y1}$ and an actual composition $BO_{y2}$, where $y2/y1 > x2/x1$; and (g) forming a third capacitor upper electrode on the second capacitor upper electrode, the third capacitor upper electrode having a composition containing metal of the platinum group, and (h) forming a multilayer wiring structure above the lower interlevel insulating film, covering the ferroelectric capacitor and including interlevel insulating films and wirings.

It is possible to suppress abnormal growth and generation of voids in the upper electrode, during forming the upper electrode.

BRIEF DESCRIPTION OF THE DRAWINGS

FIG. 2E is a table collectively showing measurement results.

FIGS. 7A and 7B are a schematic cross sectional view showing a ferroelectric capacitor structure used in preliminary experiments, and a SEM photograph showing the cross sectional structure of a prototype sample.

FIGS. 8A and 8B are a schematic cross sectional view showing the state that a hard mask layer is formed on a ferroelectric capacitor structure, used in preliminary experiments, and a SEM photograph showing a cross sectional structure of a prototype sample.

DESCRIPTION OF THE PREFERRED EMBODIMENTS

Figure 1A:
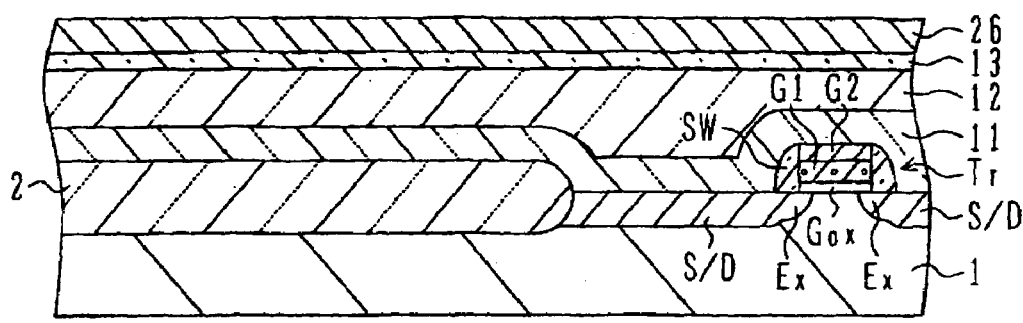
FIGS. 1A to 1L are cross sectional views of a semiconductor substrate illustrating main processes of a method of manufacturing a semiconductor device according to a first embodiment of the present invention.

Prior to description of embodiments of the present invention, preliminary experiments made by the inventor will be described. On the basis of the proposal by JP-A-2002-324894, the upper electrode of a ferroelectric capacitor was formed by laminating a first conductive oxide film having a low oxidation degree, and a second conductive oxide film having a high oxidation degree and a composition near the stoichiometric composition on the first conductive oxide film. The second conductive oxide film is a film for shielding hydrogen and $H_2O$ (e.g., hydrogen and $H_2O$ generated when an interlevel insulating film is formed or when a W conductive layer is formed in a contact hole formed through the interlevel insulating film) invading from an upper region of the capacitor. In order to provide sufficient function, a thickness of the second conductive oxide film is required to be 100 nm or thicker. It has been found, however, that as the second conductive oxide film becomes thick, abnormal growth is likely to occur. Particularly when the film is formed at high temperature, the film having a thickness of 100 nm or thicker is likely to grow abnormally. In order to suppress abnormal growth, a trial was conducted to grow the second conductive oxide film at low temperature and form a conductive oxide film in an amorphous phase.

As shown in FIG. 7A, on a TiAlN film 101 functioning as an oxygen barrier layer, an Ir lower electrode 102 and a PZT ferroelectric film 103 were formed, an $IrO_x$ film 104 as a first upper electrode whose oxidation degree was suppressed was formed on the PZT ferroelectric film, and then an $IrO_x$ film 105 whose oxidation degree was increased was formed by reactive sputtering in an amorphous phase. Although an $IrO_x$ 105a in the amorphous phase was initially formed, a crystallized $IrO_x$ film 105b was then formed by a temperature rise during film formation.

Figure 7B:
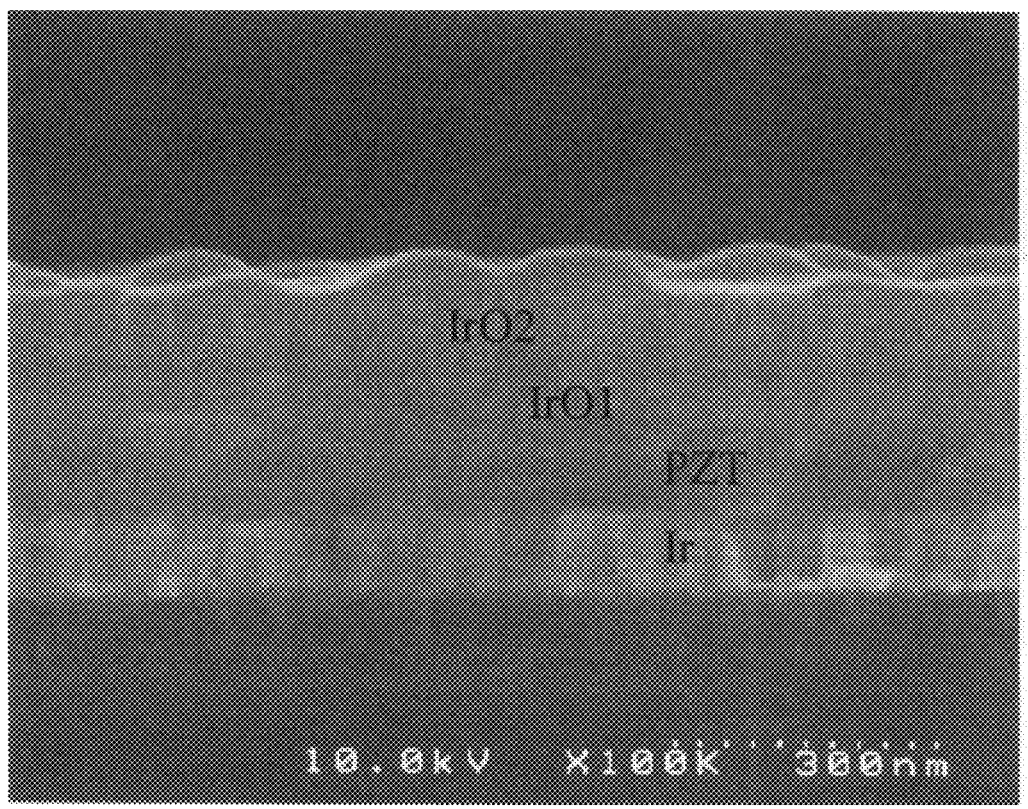

FIG. 7B is a SEM photograph showing the cross sectional structure at the stage when the lamination structure was formed. The first and second $IrO_x$ films are represented by IrO1 and IrO2, respectively. It seems that the state immediately after film formation poses no problem.

As shown in FIG. 8A, a TiN film 106 to be used as a hard mask was formed on the lamination structure. Heating during film formation crystallized the amorphous phase $IrO_x$ film 105a, formed holes or voids and changed the $IrO_x$ film 105a to a film including voids or defects. It can be considered that oxygen was removed during crystallization and oxygen vacancies were formed. As a silicon oxide film to be used as a hard mask was formed by using tetraethoxysilane (TEOS) as source material, the voids or defects structure was emphasized more. Forming the TiN film was performed at a temperature of, e.g., about 300° C., and forming the silicon oxide film was performed at a temperature of, e.g., 380° C. to 400° C.

Figure 8B:
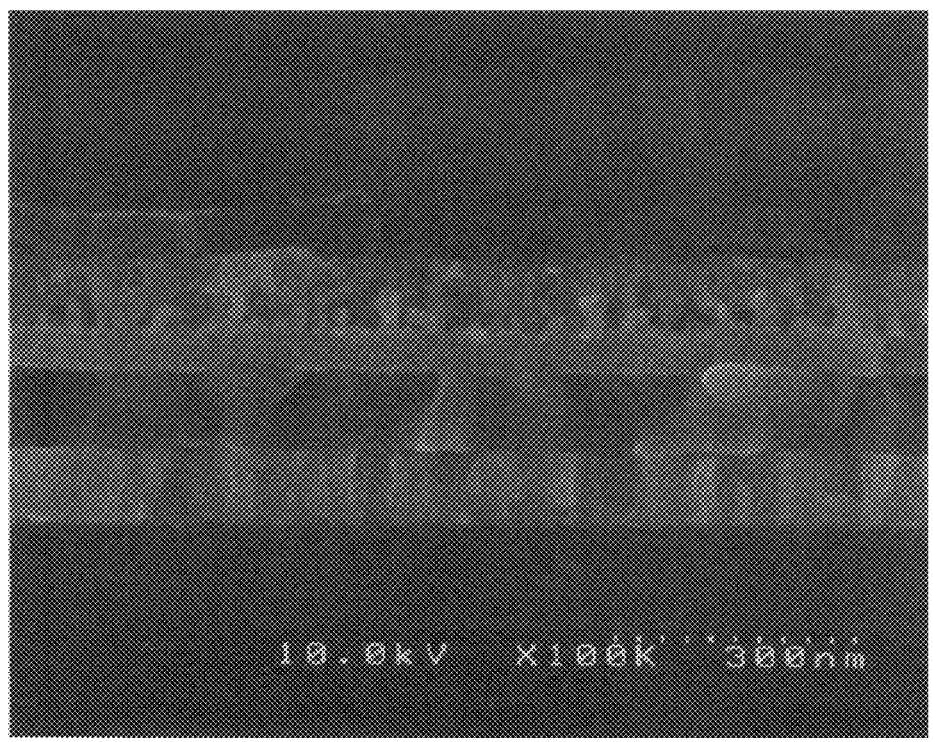

FIG. 8B is a SEM photograph showing the cross sectional view of a state wherein holes or voids were formed. It can be observed that a number of holes or voids 107 are formed and the film is changed to an $IrO_x$ film with voids or defects. A film having these vacancies passes hydrogen easily.

If a multilayer wiring forming process is executed in the state that such vacancies exist, there is a high possibility that hydrogen and the like invade and the electrical characteristics of a ferroelectric capacitor are degraded. For example, a switching charge Qsw is halved. Stripping or peeling-off is likely to occur during the multilayer wiring forming process.

W plugs are widely used also in FeRAM. Use of W plugs is essential particularly for FeRAM having a high integration density. In forming a W plug on a ferroelectric capacitor, a contact hole is formed, a TiN film as a glue film is formed, and then a W film is formed on the TiN film. The W film is formed in a reducing atmosphere. Most of hydrogen generated during film formation is blocked by the TiN film as the glue film. However, if excessive hydrogen is supplied, hydrogen may pass through the blocking TiN film, and invade the upper electrode. If $IrO_x$ of the upper electrode is reduced, volume contraction of the upper electrode occurs and a gap is formed between the glue film and upper electrode. A contact resistance of the upper electrode may become unstable.

The present inventor has studied a method of suppressing abnormal growth of the upper electrode during film formation and suppressing generation of vacancies such as oxygen vacancies. Embodiments of the present invention will now be described.

The structure of FeRAM is roughly classified into a planar type in which a ferroelectric capacitor is formed on an insulating film and contacts of the upper and lower electrodes are formed downward, and a stack type in which the lower electrode is connected to a conductive plug buried in an insulating film, a ferroelectric capacitor is formed on an insulating film, and a contact of the upper electrode is formed downward.

With reference to FIGS. 1A to 1L, description will be made on manufacture processes for a planar type FeRAM and a structure of the manufactured FeRAM, according to the first embodiment of the present invention.

As shown in FIG. 1A, for example, on the surface of a p-type Si substrate 1, an isolation region 2 is formed, for example, by local oxidation of silicon (LOCOS) to define active regions. The surfaces of the active regions are thermally oxidized to form a silicon oxide film having a thickness of, e.g., about 10 nm to be used as a gate oxide film Gox. On the gate oxide film Gox, a polycide gate electrode G is formed which is a lamination of a first gate electrode G1 of polysilicon and a second gate electrode G2 of silicide. By using a resist pattern, the lamination is patterned to form the gate electrode G, and thereafter, n-type impurity ions, e.g., As, are implanted shallowly to form low concentration extension regions Ex.

After the extension regions are formed, an insulating film of silicon oxide or the like is deposited by chemical vapor deposition (CVD), and anisotropic etching is performed by reactive ion etching (RIE) or the like to remove the insulating film on a flat surface and leave sidewall spacers SW on the sidewalls of the gate electrode G. After the sidewall spacers SW are formed, n-type impurity ions, e.g., P are implanted to form high concentration source/drain regions S/D. In this way, a MOS transistor structure Tr is formed.

A silicon oxynitride film 11 is formed by CVD, covering the MOS transistor Tr. The silicon oxynitride film 11 has a function of a barrier film against invasion of hydrogen, oxygen and the like. On the silicon oxynitride film 11, a silicon oxide film 12 as a lower interlevel insulating film is formed by CVD using TEOS. When necessary, the surface of the silicon oxide film 12 is planarized by chemical mechanical polishing (CMP). A thickness of the silicon oxide film 12 is set to about 700 nm. Annealing is performed at 650° C. for about 30 minutes in a $N_2$ atmosphere. Degassing (removal of moisture and the like) of the silicon oxide film 12 is therefore performed. On the silicon oxide film 12, an alumina (AlO) film 13 is formed by sputtering to a thickness of about 20 nm. The alumina film is used as a tight adhesion film having a function of adhering the lower electrode of a ferroelectric capacitor.

A Ti film or $TiO_x$ film having a thickness of about 20 nm may be used as the tight adhesion film.

On the tight adhesion film 13, a Pt film 26 as the lower electrode is formed to a thickness of about 150 nm, for example, by sputtering. If the tight adhesion film 13 is made of Ti, a Ti film having a thickness of about 20 nm is formed at a substrate temperature (film forming temperature) of 150° C., and then a Pt film having a thickness of about 180 nm is formed at a substrate temperature of 100° C. or 350° C.

Figure 1B:
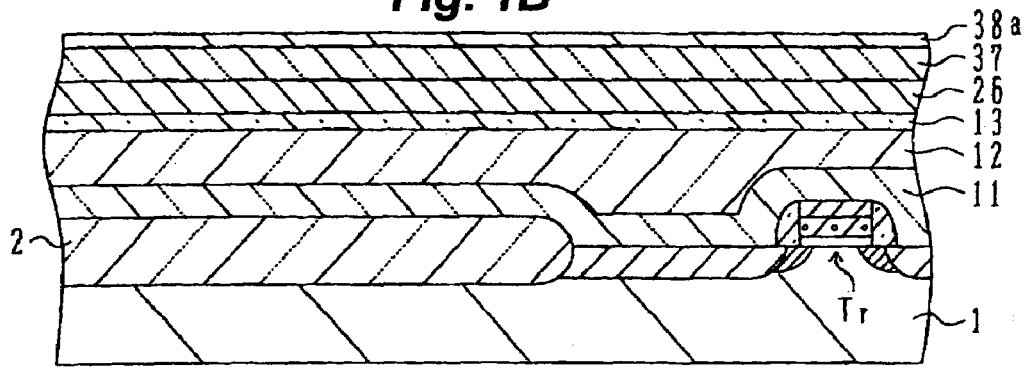

As shown in FIG. 1B, on the lower electrode 26, a ferroelectric film 37 is formed in an amorphous phase. For example, by using PLZT {(Pb, La) (Zr, Ti)$O_3$} as a target, a PLZT film having a thickness of about 100 nm to 200 nm is formed by RF sputtering. After the ferroelectric film 37 is formed, heat treatment is performed by rapid thermal annealing (RTA) at a temperature of 650° C. or lower, e.g., 560° C. in an atmosphere which contains Ar and $O_2$, and heat treatment is further performed by RTA at 750° C. in an oxygen atmosphere. These heat treatments crystallize perfectly the ferroelectric film 37. Furthermore, the Pt film as the lower electrode 26 is made dense so that mutual diffusion of Pt and O near at the interface with the ferroelectric film 37 can be suppressed.

A first upper electrode 38a is formed on the ferroelectric film 37. For example, an $IrO_x$ film having a thickness of 20 nm to 50 nm is formed by reactive sputtering in the crystallization state when the film is formed. The film forming conditions are, for example, as in the following.

Target: Ir,
Substrate temperature during film formation: 300° C.,
Film forming work gas: $Ar+O_2$,
Flow rate: [Ar]=140 sccm, $[O_2]$=60 sccm,
Flow rate ratio: $[O_2]/[Ar]$=0.43,
Sputtering power: about 1 kW to 2 kW.

$IrO_x$ of the first conductive oxide film 38a formed by reactive sputtering has a composition whose oxygen composition x is smaller than that of the stoichiometric composition (x=2).

Figure 1C:
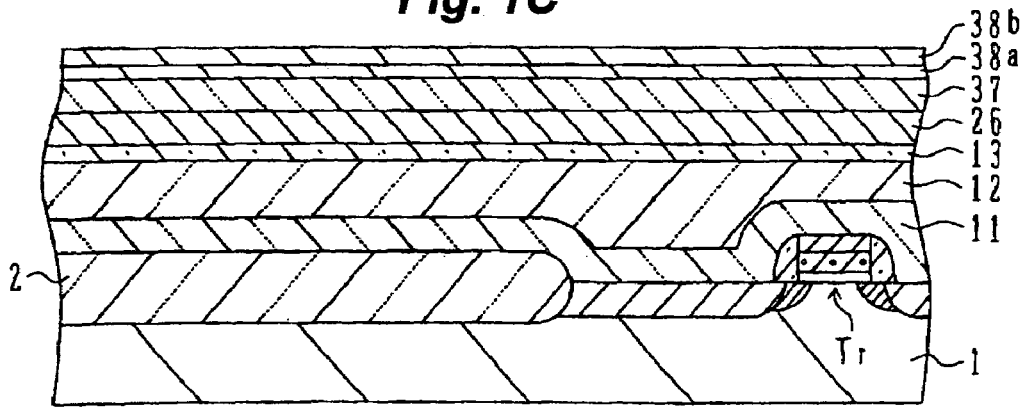

As shown in FIG. 1C, an $IrO_y$ film having a thickness of 30 nm to 100 nm as a second conductive oxide film 38b is formed on the first conductive oxide film 38a by reactive sputtering. The film forming conditions are, for example, as in the following.

Target: Ir,
Substrate temperature during film formation: 300° C.,
Film forming work gas: $Ar+O_2$,
Flow rate: [Ar]=100 sccm, $[O_2]$=100 sccm,
Flow rate ratio: $[O_2]/[Ar]$=1.00,
Sputtering power: about 1 kW to 2 kW.

$IrO_y$ of the second conductive oxide film 38b did not grow abnormally, but a uniformly crystallized film was obtained. $IrO_y$ of the second conductive oxide film 38b has an oxygen composition y higher than the oxygen composition x of the first conductive oxide film $IrO_x$, y>x, and nearer to the stoichiometric composition.

Figure 1D:
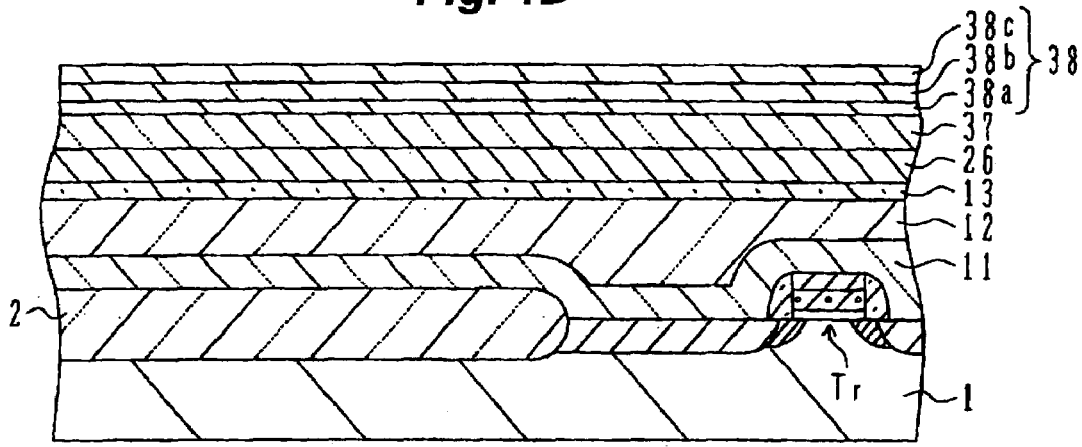

As shown in FIG. 1D, on the second conductive oxide film 38b of $IrO_y$, a third conductive oxide film 38c of $IrO_z$ having a thickness of 50 nm to 150 nm is formed. The film forming conditions are, for example, as in the following.

Target: Ir,
Substrate temperature during film formation: 300° C.,
Film forming work gas: $Ar+O_2$,
Flow rate: [Ar]=160 sccm, $[O_2]$=40 sccm,
Flow rate ratio: $[O_2]/[Ar]$=0.25,
Sputtering power: about 1 kW to 2 kW.

Since the oxygen flow rate is lowered, $IrO_z$ of the third conductive oxide film 38c has a low oxygen composition z, z<y, z<x. The conductive oxide film having a high metallic composition has no abnormal growth. A very uniformly crystallized film was obtained.

A film forming temperature of the second conductive oxide film 38b and third conductive oxide film 38c is not limited to 300° C., but may be selected from a range of, e.g., 100° C. to 400° C. The $IrO_z$ is preferably formed in the crystallization state when the film is formed. To this end, the film forming temperature is preferably 100° C. or higher. If the film forming temperature is raised to 400° C. or higher, abnormal growth is likely to occur and it is difficult to form oxide. It is therefore preferable to set the temperature to 400° C. or lower. A flow rate and flow rate ratio of film forming work gasses may be selected properly in accordance with a film forming temperature.

In place of the third conductive oxide film, a film of a metal of the platinum group may be used such as an Ir film and a Ru film. If an Ir film is to be formed, this film can be formed by sputtering, for example, at 400° C. at an Ar flow rate of 199 sccm. A combination of the first upper electrode 38a, second upper electrode 38b and third upper electrode 38c constitutes the upper electrode 38 of the ferroelectric capacitor.

In this embodiment, the PLZT ferroelectric film 37 is formed by sputtering and crystallized by RTA at a temperature of, e.g., 560° C. followed by RTA at a temperature of, e.g., 750° C., and the upper electrode is formed on the PLZT ferroelectric film. Several modifications of this manufacture method are possible. These modifications will now be described.

Figure 2A:
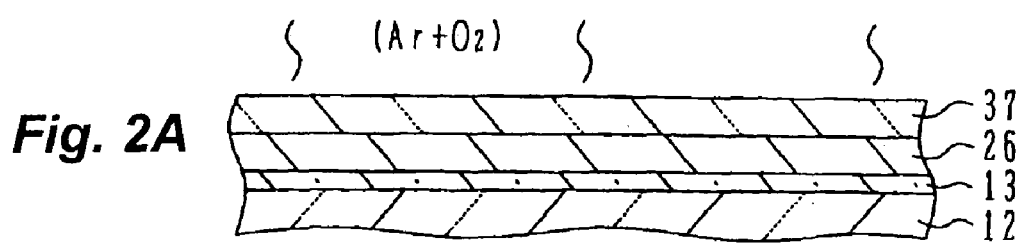
FIGS. 2A to 2D are cross sectional views of a semiconductor device illustrating modifications of the first embodiment.

As shown in FIG. 2A, in the first and second modifications, similar to the first embodiment, after a ferroelectric film 37 is formed, RTA is performed at 650° C. or lower, e.g., 560° in an atmosphere which contains Ar and $O_2$, and the following RTA at 750° C. in $O_2$ is omitted.

Figure 2B:
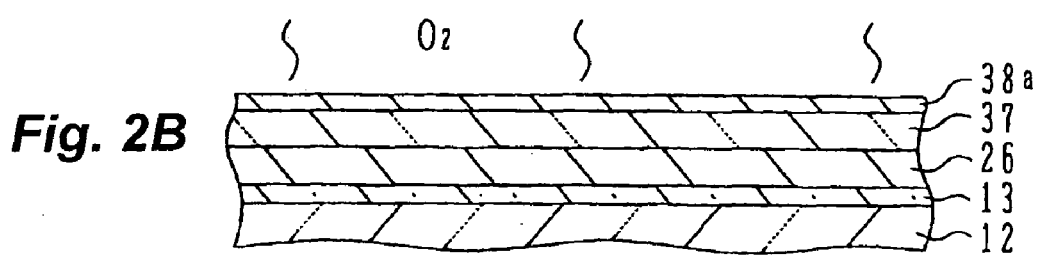

As shown in FIG. 2B, on the ferroelectric film 37, an $IrO_x$ film 38a having a thickness of 20 nm to 75 nm is formed by reactive sputtering at a room temperature (first modification) or at high temperature (second modification). In the first modification (room temperature film formation), the film forming conditions are, for example, an Ar flow rate of 100 sccm, an $O_2$ flow rate of 56 sccm and a film forming power of 2 kW. In the second modification (high temperature film formation), the film forming conditions are, for example, a substrate temperature of 300° C., an Ar flow rate of 140 sccm, an $O_2$ flow rate of 60 sccm and a film forming power of 1 kW. Thereafter, heat treatment is performed at a temperature of 650° C. to 750° C., e.g., 725°. This heat treatment crystallizes perfectly the ferroelectric film 37. At the same time, the interface between the ferroelectric film 37 and first conductive oxide film 38a becomes flat. These results are advantageous for a low voltage operation and switching of the ferroelectric capacitor.

Figure 2C:
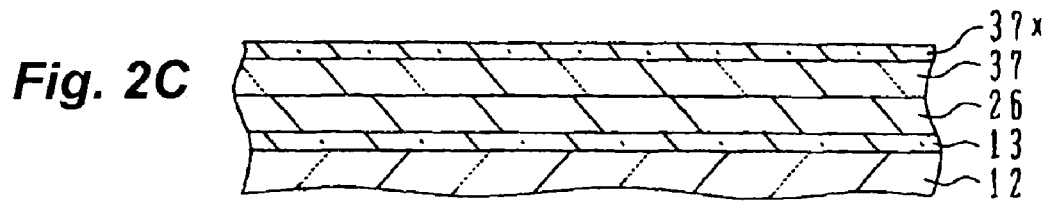

FIG. 2C shows the third modification. After the ferroelectric film 37 is formed in the similar manner to that described above, heat treatment is performed at a temperature of, e.g., 560° C. to crystallize the film. Thereafter, a thin amorphous ferroelectric film 37x is formed on the ferroelectric film 37. On the thin ferroelectric film 37x, a first conductive oxide film is formed by the similar manner to that described above, and heat treatment is performed. As the amorphous ferroelectric film is laminated after the ferroelectric film is formed once, it is possible to obtain the advantage of reducing leak current of the capacitor. The ferroelectric film 37 may be formed in a crystallization state. In this case, without heat treatment, the amorphous ferroelectric film 37x is formed thereon.

Figure 2D:
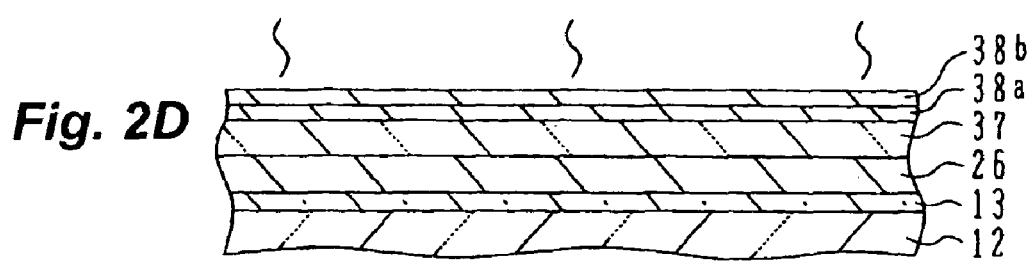

FIG. 2D shows the fourth modification. After the first conductive oxide film 38a and second conductive oxide film 38b are formed, heat treatment is performed at 650° C. to 750° C., e.g., 700° C. This heat treatment improves tight adhesion between the upper electrode and ferroelectric film and crystallinity of the upper electrode. Description will be reverted to the first embodiment.

Figure 1E:
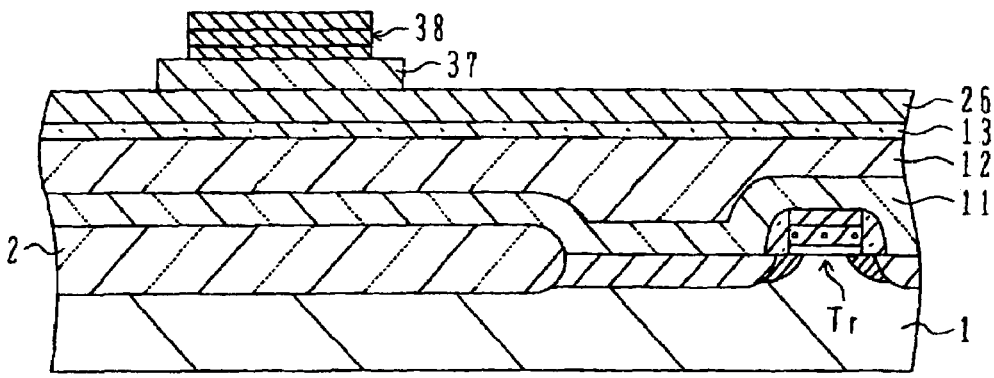

As shown in FIG. 1E, back side cleaning is performed to remove attachments during the film forming processes. Thereafter, the upper electrode, ferroelectric film and lower electrode are etched in tiers or stepwise. First, a resist pattern is formed on the upper electrode 38 and the upper electrode is patterned by dry etching. After etching, the resist pattern is removed and an annealing process is executed at 650° C. for 60 minutes in an oxygen atmosphere. Physical damages caused in the ferroelectric film 37 by the dry etching can therefore be recovered. Next, a resist mask having a desired pattern of the ferroelectric film is formed and the ferroelectric film 37 is patterned. Next, resist mask is removed, and oxygen annealing is performed.

Figure 1F:
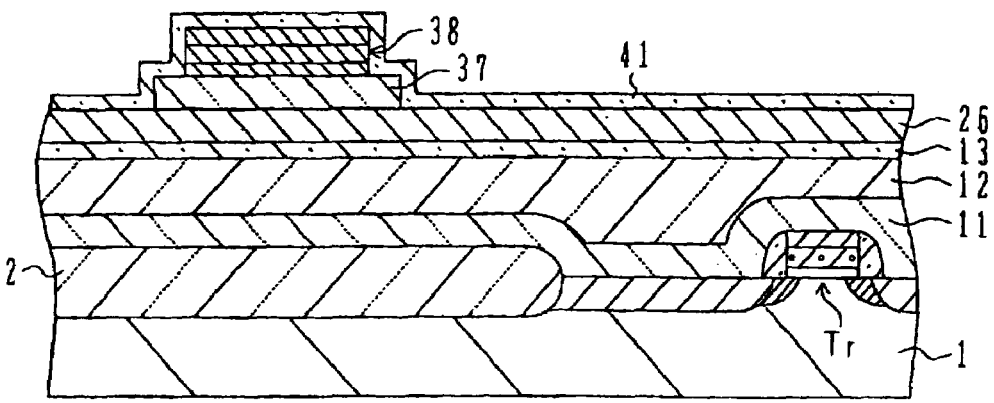

As shown in FIG. 1F, an alumina film 41 is formed by sputtering, covering the patterned ferroelectric film 37 and upper electrode 38. The alumina film has a function of preventing invasion of hydrogen. Oxygen annealing is performed to relax damages caused by sputtering.

Figure 1G:
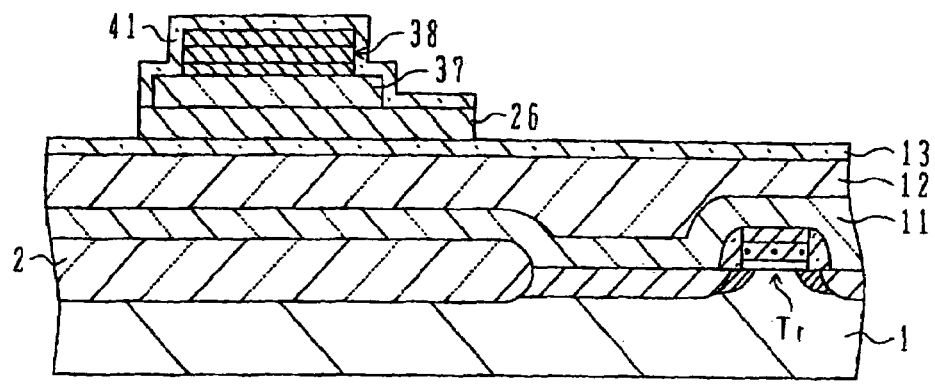

As shown in FIG. 1G, by using a resist pattern, the alumina film 41 and lower electrode 26 are patterned. After etching, the resist pattern is removed and oxygen annealing is performed.

Figure 1H:
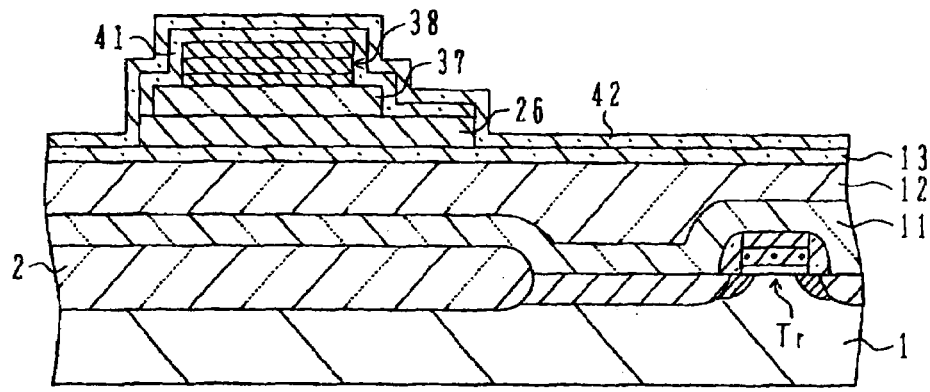

As shown in FIG. 1H, an alumina film 42 is further formed by sputtering, covering the patterned alumina film 41. Next, oxygen annealing is performed. The oxygen annealing before this alumina film is formed is effective for preventing stripping or peeling-off of the alumina film. The oxygen annealing after the last alumina film was formed is effective for reducing capacitor leak current. The MOS transistor and ferroelectric capacitor are formed in this way, which are main constituent elements of FeRAM. Wirings between the constituent elements are still not formed.

Figure 1I:
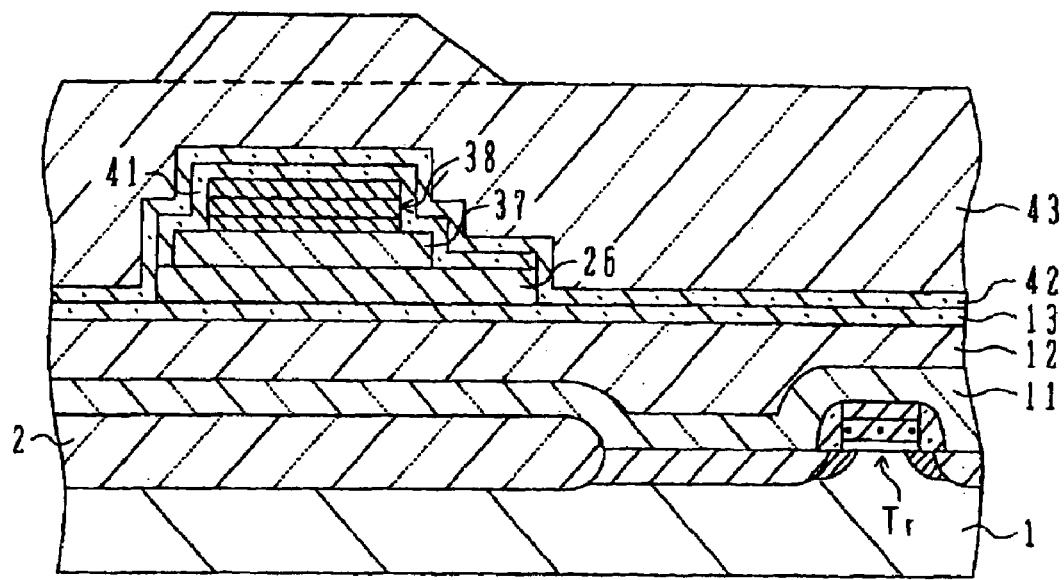

As shown in FIG. 1I, an interlevel insulating film 43 of silicon oxide having a thickness of, e.g., about 1.5 μm is formed on the whole substrate surface by high density plasma (HDP) CVD. Next, the interlevel insulating film 43 is planarized by CMP. A plasma process using $N_2O$ gas is executed to nitridize the surface of the interlevel insulating film 43. The nitridized surface becomes a barrier against permeation of moisture. Instead of the $N_2O$ plasma process, a plasma process may be performed which contains at least one of N and O.

Figure 1J:
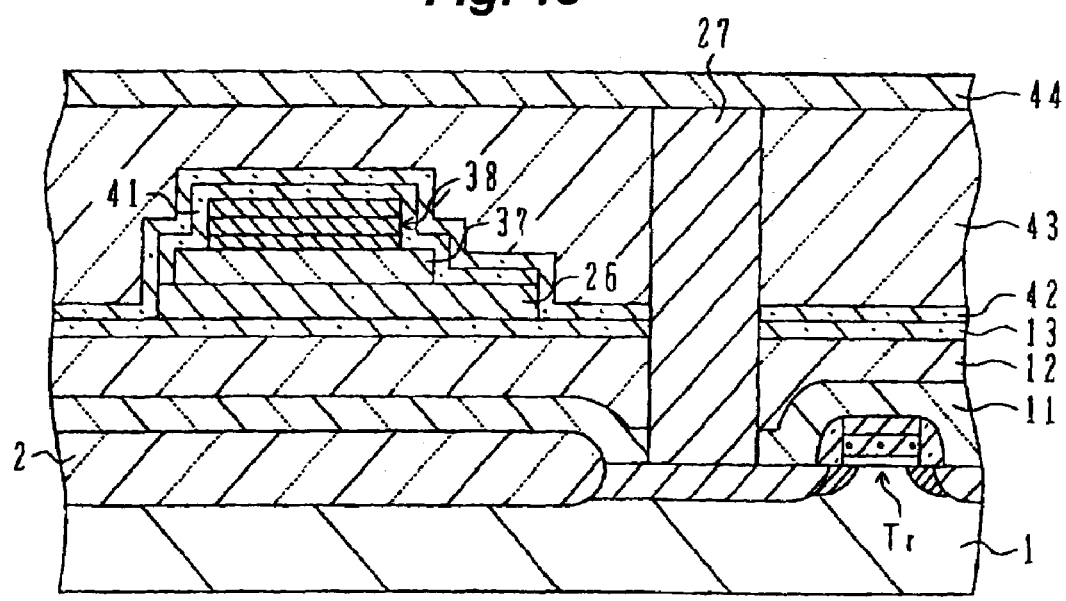

As shown in FIG. 1J, a contact hole reaching one of the source/drain regions S/D of the MOS transistor Tr is formed through the interlevel insulating film 43, alumina films 42 and 13, silicon oxide film 12 and silicon oxynitride film 11. A Ti film and then a TiN film are formed by sputtering. These films constitute a barrier metal film. Then, a W film is formed by CVD to be buried in the contact hole. Unnecessary W film, TiN film and Ti film deposited on the flat surface are removed by CMP to form a W plug 27. A SiON film 44 is formed covering the W plug 27. The SiON film 44 functions as an oxidation preventive film for the W plug 27.

Figure 1K:
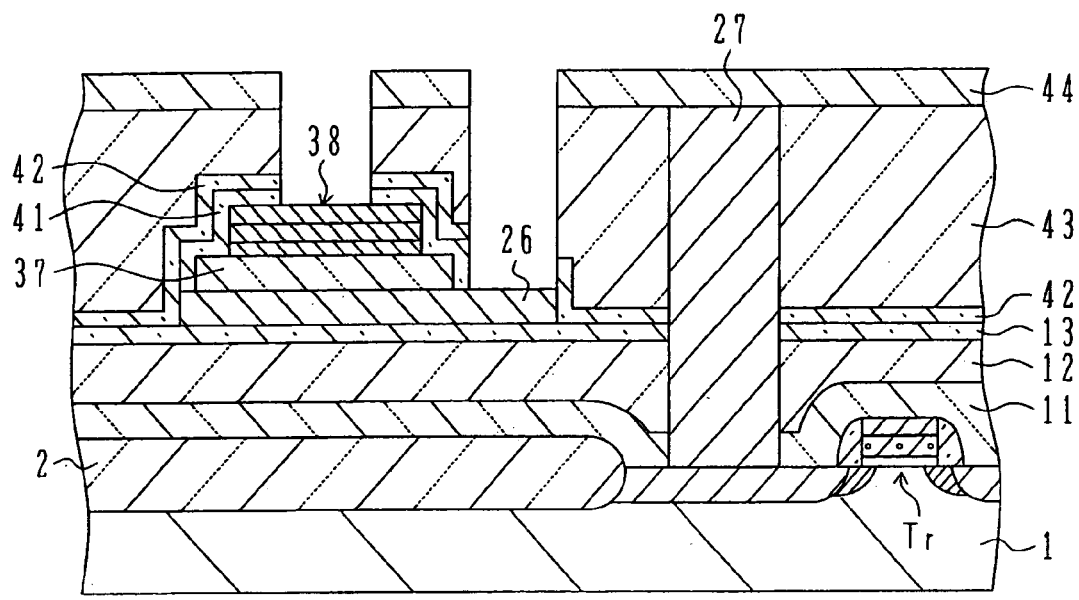

As shown in FIG. 1K, contact holes are formed through the SiON film 44 and interlevel insulating film 43 and further alumina films to expose the upper electrode 38 and lower electrode 26 of the ferroelectric capacitor. After the contact holes are formed, oxygen annealing is performed to recover damages and degas moisture and the like in the interlevel insulating film.

Figure 1L:
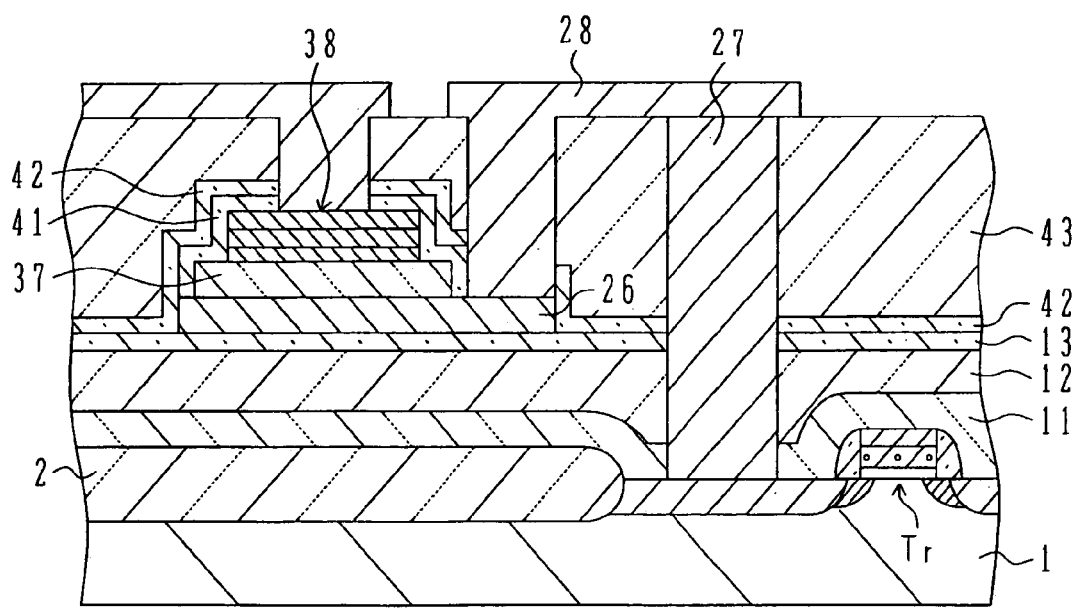

As shown in FIG. 1L, the SiON film 44 is removed by etch-back to expose the surface of the W plug 27. Next, an Al wiring layer is formed and patterned to form alumina wirings 28. In the structure shown in the figure, the lower electrode 26 of the ferroelectric capacitor is connected to one of the source/drain regions S/D of the MOS transistor via the Al wiring 28 and W plug 27.

Forming an interlevel insulating film and wirings is repeated. Contact plugs are formed in interlevel insulating films where necessary. After wirings are formed, a silicon oxide film formed by TEOS and a cover film of SiN are formed. In this way, a FeRAM device is manufactured.

By using the methods of the first embodiment and its modifications, various types of iridium oxide films were formed, and stoichiometry was measured with a high resolution Rutherford backward scattering (RBS) analyzer HRBSV500.

FIG. 2E is a table collectively showing the measurement results. $IrO_x$ indicates the first iridium oxide film. $IrO_y$ indicates the second iridium oxide film. $IrO_z$ indicates the third iridium oxide film.

In the case of the film forming temperature of 300° C. (the first embodiment), the first iridium oxide film $IrO_x$ formed at the [Ar]:[$O_2$] flow rate ratio of 140:60 has an oxygen composition x=1.92 and is in the oxygen shortage state from the stoichiometric composition (x=2). The second iridium oxide film $IrO_y$ formed at the [Ar]:[$O_2$] flow rate ratio of 100:100 has an oxygen composition y=2.02 and is in the slightly excessive oxygen state almost equal to the stoichiometric composition (y=2). The second iridium oxide film $IrO_y$ formed by lowering slightly the [Ar]:[$O_2$] flow rate ratio of 120:80 has an oxygen composition y=2.00 just equal to the stoichiometric composition. (y=2). The third iridium oxide film $IrO_z$ formed at the [Ar]:[$O_2$] flow rate ratio of 160:40 has an oxygen composition z=1.84 which is the highest degree of oxygen shortage from the stoichiometric composition (z=2). If the film is formed at the same temperature and the same total flow rate, the oxygen composition is considered to be determined almost by the flow rate ratio [$O_2$]/[Ar].

In the case of the film forming temperature of 20° C. (the first modification), the first iridium oxide films $IrO_x$ formed at the [Ar]:[$O_2$] flow rate ratios of 100:52 and 100:59 have oxygen compositions x=1.20 and 1.50, respectively. Although the flow rate ratio [$O_2$]/[Ar] is higher than that of film formation at 300° C., the oxygen composition x is lower. Since the conditions are changed by changing the total flow rate, simple comparison should not be made and it is desired to confirm the tendency experimentally. The second iridium oxide film $IrO_y$ formed at the [Ar]:[$O_2$] flow rate ratio of 100:100 has an oxygen composition y=2.10. It is considered that the excessive oxygen state is increased more than that of film formation at 300° C.

The oxygen compositions are x=1.92, y=2.02 and z=1.84 at the film forming temperature of 300° C. and at the flow rate ratio of the first embodiment. The oxygen compositions of the first and third iridium oxide films are lower than the stoichiometric composition, and the second iridium oxide film has an oxygen composition almost equal to the stoichiometric composition. An oxidation degree of the second $IrO_y$ film is higher than the first $IrO_x$ film of the upper electrode, and has an oxygen composition almost equal to the stoichiometric composition. An oxidation ratio of the third $IrO_z$ film is lower than the second $IrO_y$ film and lower than the first $IrO_x$ film.

Indicating the real composition with a suffix 1, and the stoichiometric composition with a suffix 2, $x_1$=1.92 and $x_2$=2.00 makes the relative composition or ratio $r_x$=$x_1$/$x_2$=1.92/2.00=0.96. It may be considered that the ratios are preferably $r_x \leq 0.96$, $r_y > 0.96$, and $r_z \leq 0.96$.

In the above description, the upper electrode is made of IrO. Since the same material is used, the oxidation degree can be compared by using only the oxygen compositions x, y and z. If different oxide materials are used, similar analysis may be made by using ratios of oxygen compositions x2, y2 and z2 to stoichiometric compositions of the material x1, y1 and z1, i.e., ratios x2/x1, y2/y1 and z2/z1.

The first conductive oxide film of the upper electrode is preferably made of a film which is suitable for forming an interface with the ferroelectric layer and having a suppressed oxidation degree. The second conductive oxide film on the first conductive oxide film is formed to have a higher oxidation degree (near the stoichiometric composition) and a limited thickness. By forming the second conductive oxide film by a film having an oxygen composition near the stoichiometric composition), it becomes possible to suppress metallic state composition, activation of hydrogen and reduction of the ferroelectric film. By limiting the thickness, it becomes possible to suppress abnormal growth. Formation of an interface layer at the interface between the first conductive oxide film and ferroelectric film can be suppressed so that growth of giant crystals can be suppressed. By forming the third conductive oxide film having a lower oxidation degree, characteristics suitable for the upper electrode of the ferroelectric capacitor can be obtained. Good ferroelectric capacitor characteristics can therefore be obtained.

It is known that Ir and Pt in a metallic state function as catalyst for hydrogen. When Ir and Pt in the metallic state contact hydrogen, the hydrogen is activated. Therefore, if a single layer Ir or Pt film is used as the upper electrode, process deterioration of the capacitor is likely to occur. Similar process deterioration is likely to occur even if an Ir or Pt film in the metallic state is formed on the first conductive oxide film. For example, after a three-layer wiring structure is formed, the switching charge of the capacitor lowers to 50% of that before wiring formation. When the first conductive oxide film is made of $IrO_x$ (x=1.3 to 1.8), the interface with the ferroelectric film is good. Since the composition x is smaller than the stoichiometric composition of 2.0, it can be considered that oxygen vacancies are formed and oxide contents and metallic state contents exist mixedly. As hydrogen invades such a film, hydrogen may be activated by metallic state contents and the characteristics of ferroelectric oxide may be degraded. As the second conductive oxide film $IrO_y$ (y=2) having the oxygen composition near the stoichiometric composition is formed on the first conductive oxide film, hydrogen is hard to be activated because the second conductive oxide film has less oxygen vacancies and contains almost no metallic state contents. It can therefore be considered that even after a multilayer wiring structure is formed above the ferroelectric capacitor, the capacitor characteristics can be retained without deterioration.

According to the embodiment described above, the interface between the upper electrode and ferroelectric film can be improved and the process deterioration can be suppressed. As a result, it is possible to improve the switching charge, lower the coercive voltage and improve fatigue resistance and imprint resistance. Although the planar type FeRAM has been described above, a stack type FeRAM may also be formed.

Figure 3A:
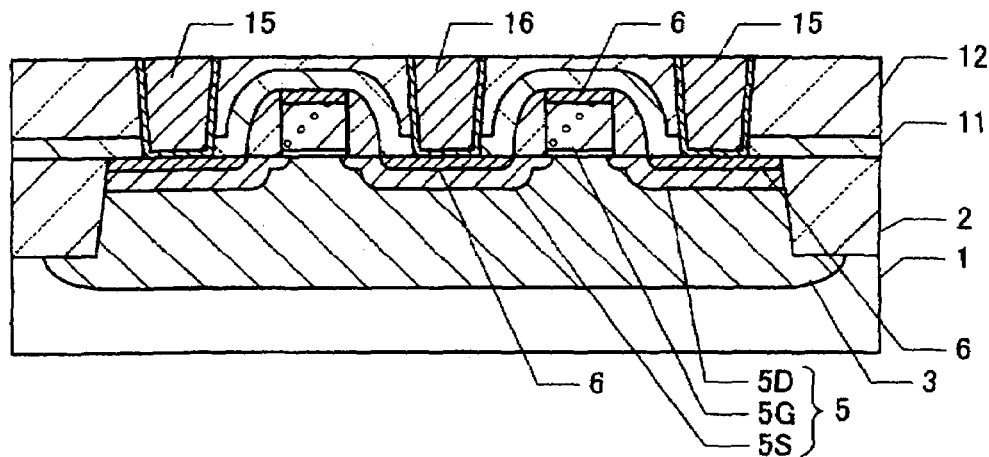
FIGS. 3A to 3T are cross sectional views of a semiconductor substrate illustrating main processes of a method of manufacturing a semiconductor device according to a second embodiment of the present invention.
Figure 3B:
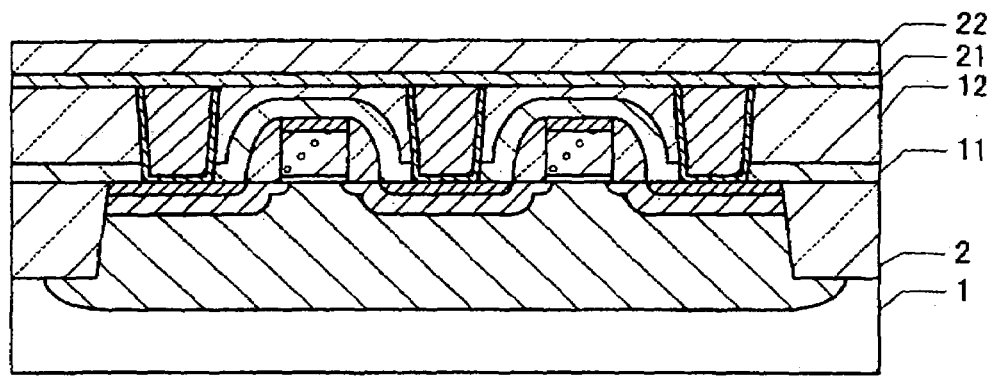
Figure 3C:
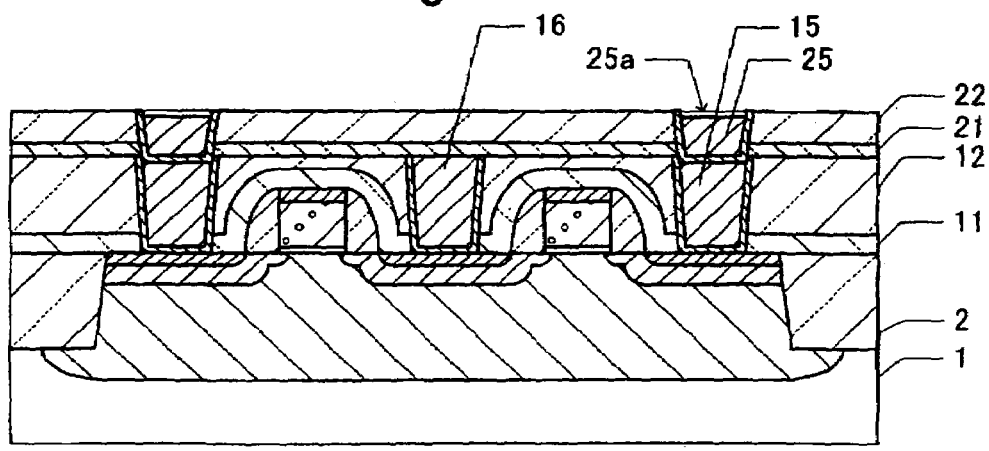
Figure 3D:
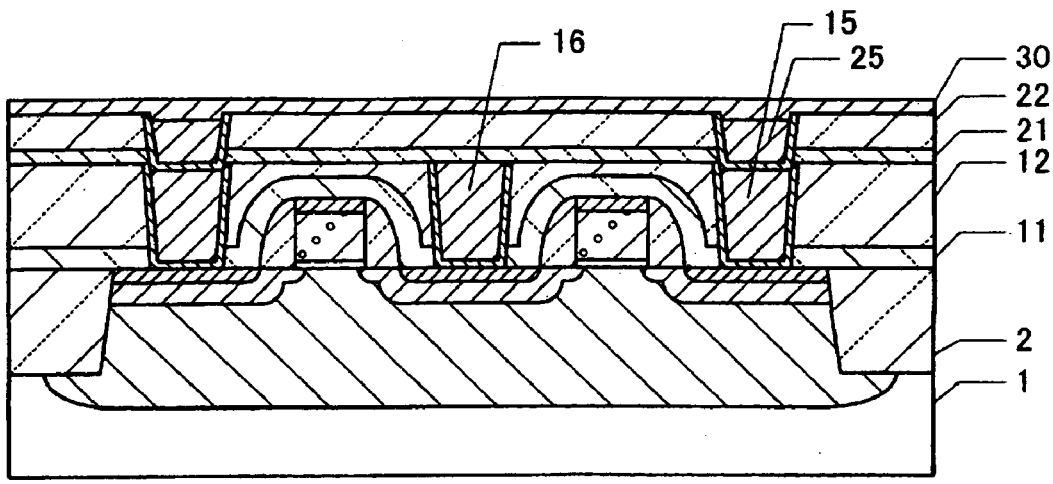
Figure 3E:
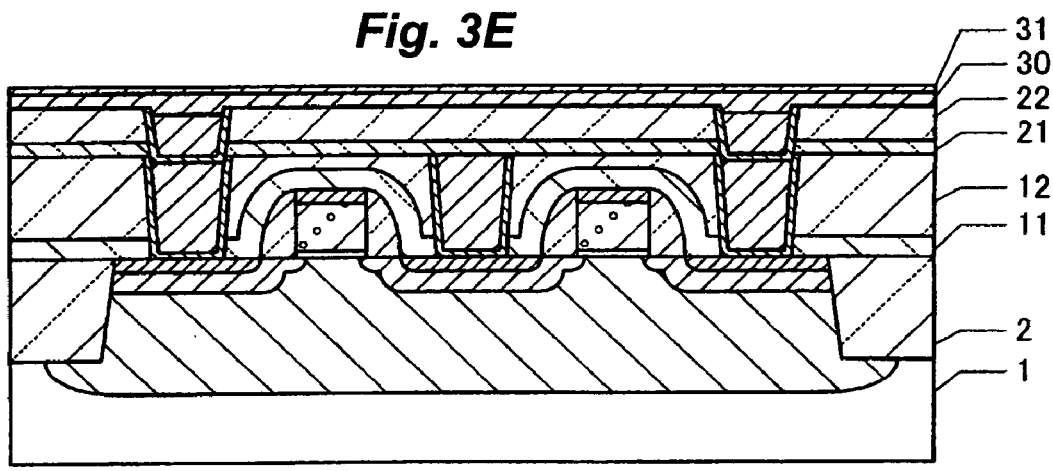
Figure 3F:
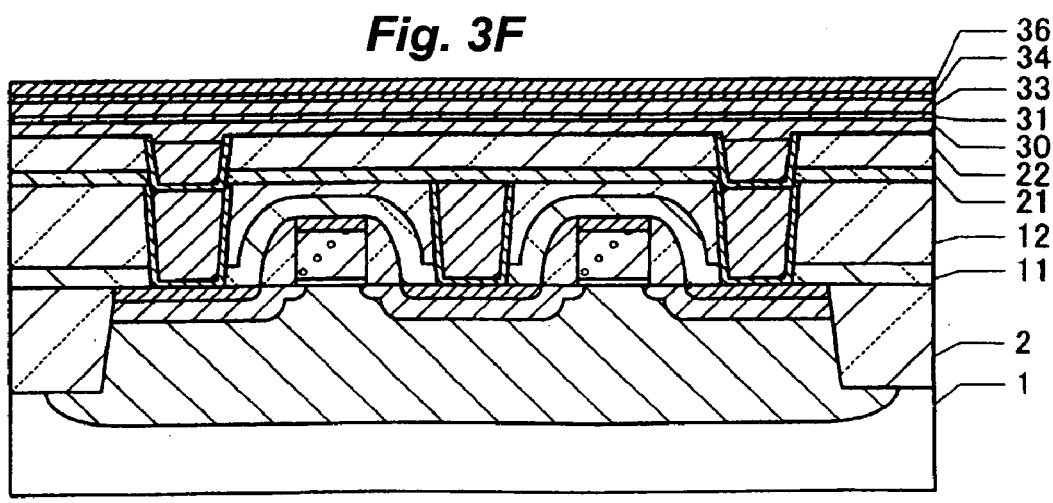
Figure 3G:
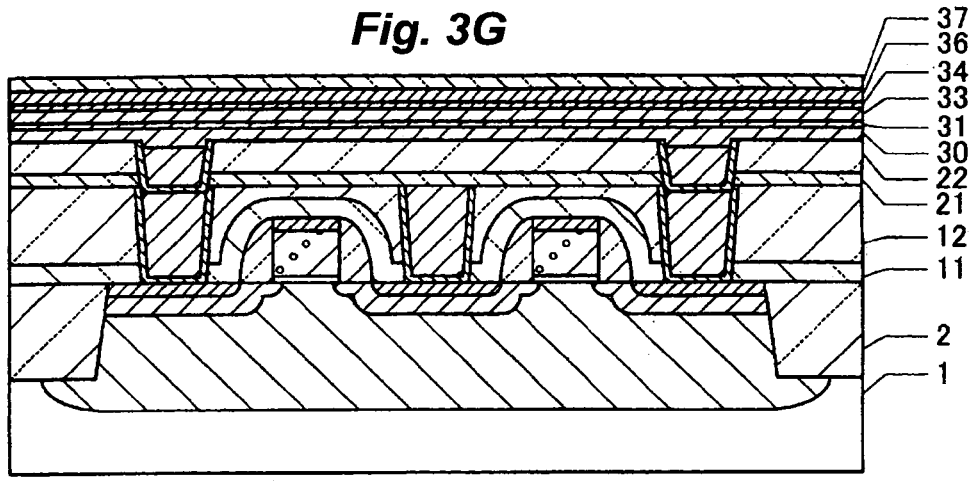
Figure 3H:
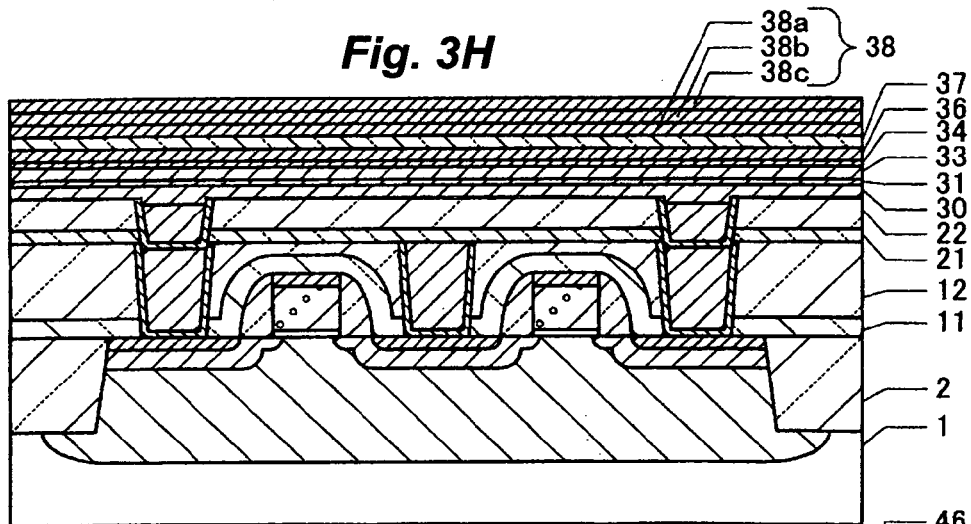
Figure 3I:
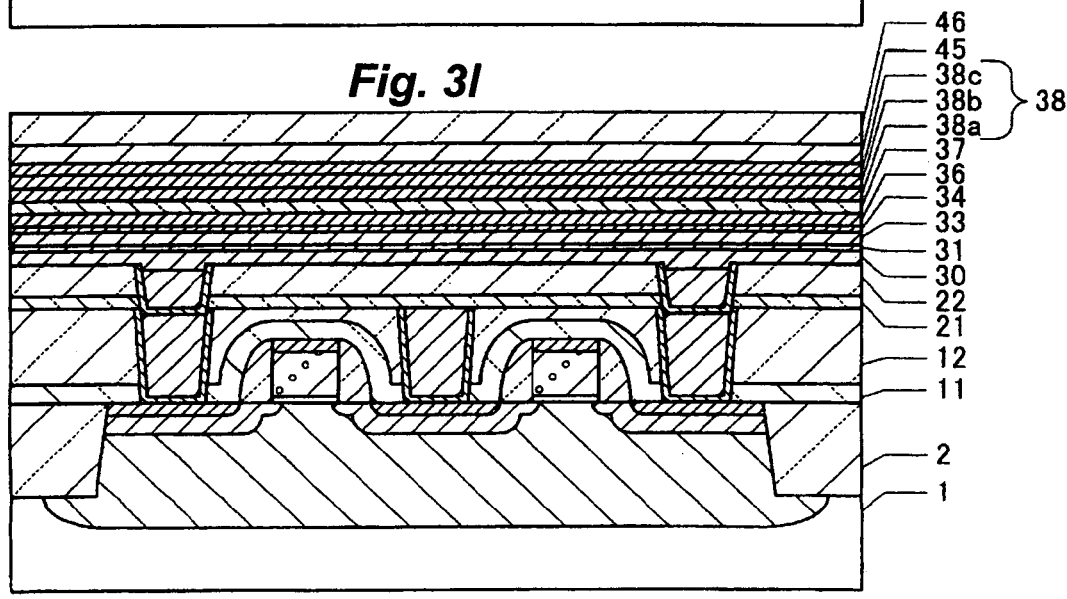
Figure 3J:
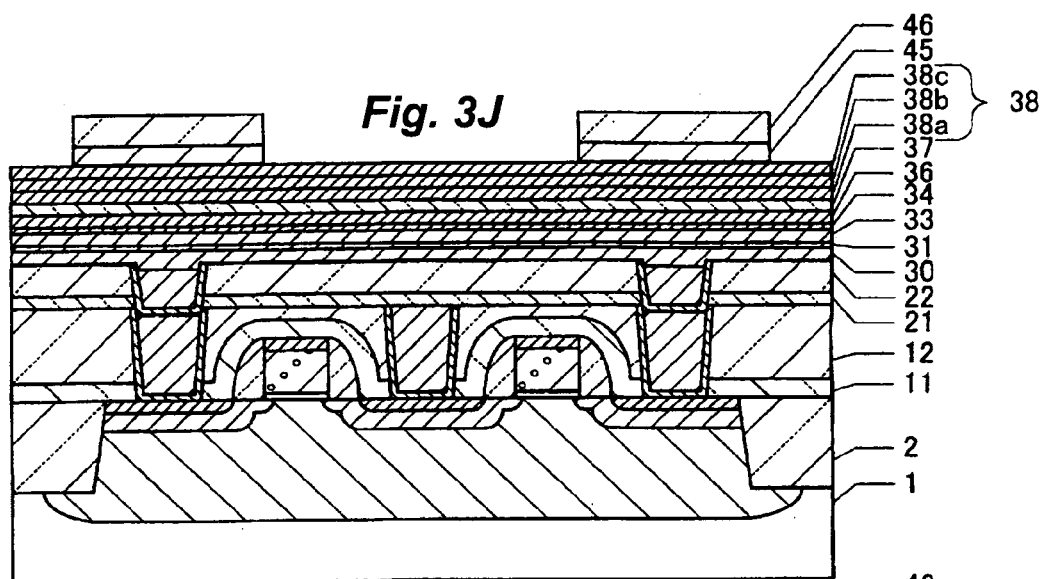
Figure 3K:
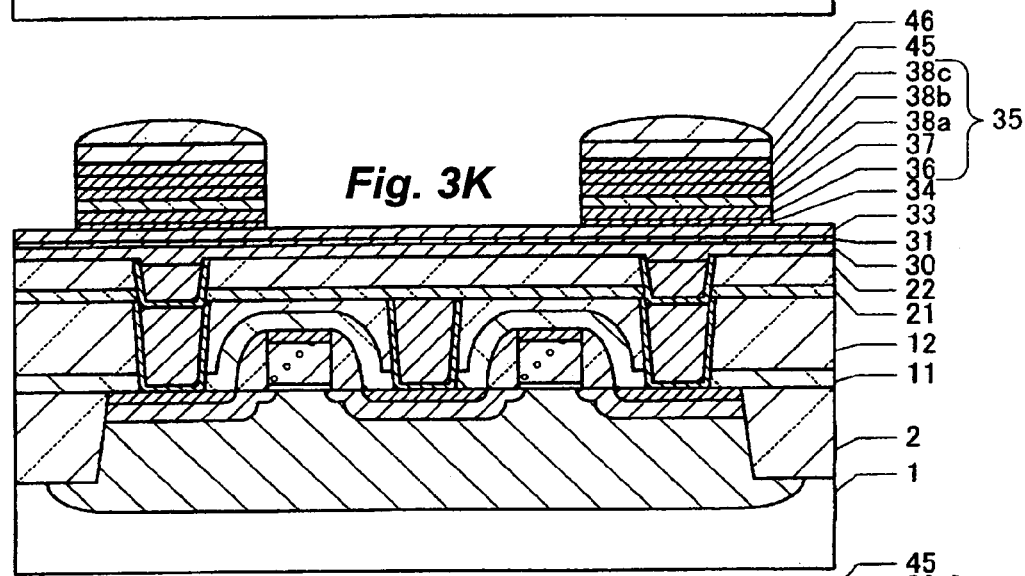
Figure 3L:
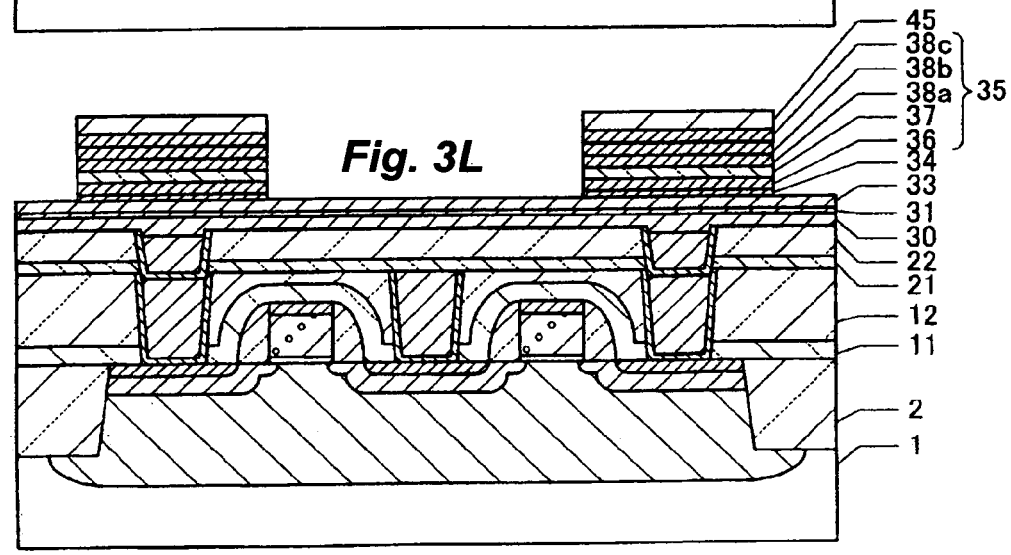
Figure 3P:
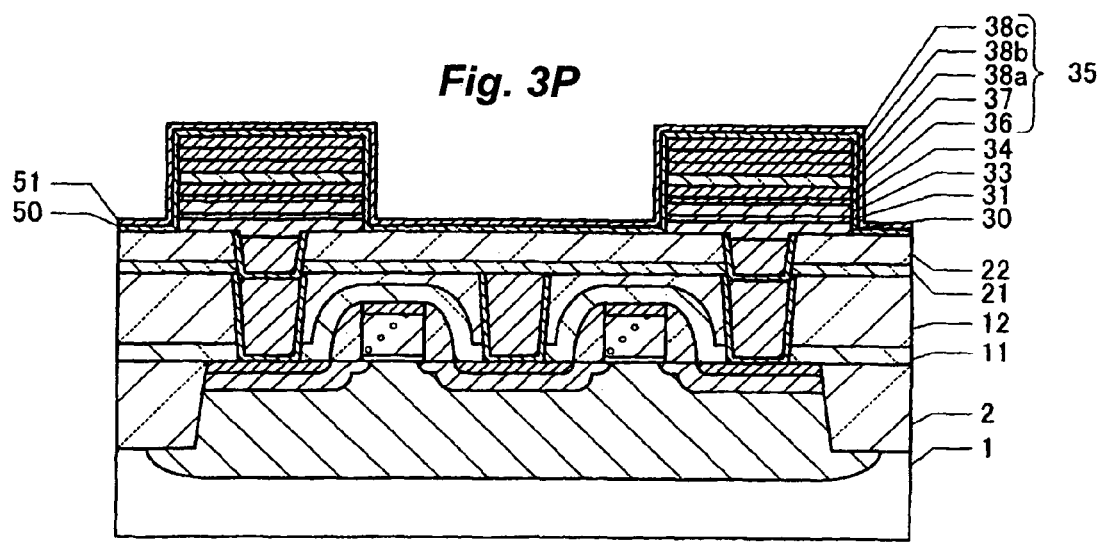
Figure 3Q:
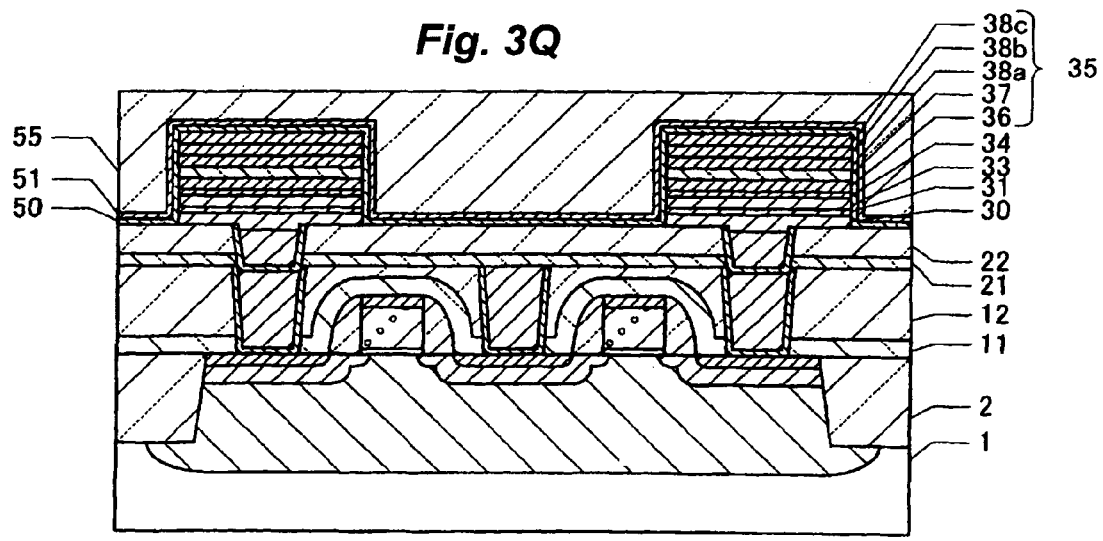
Figure 3R:
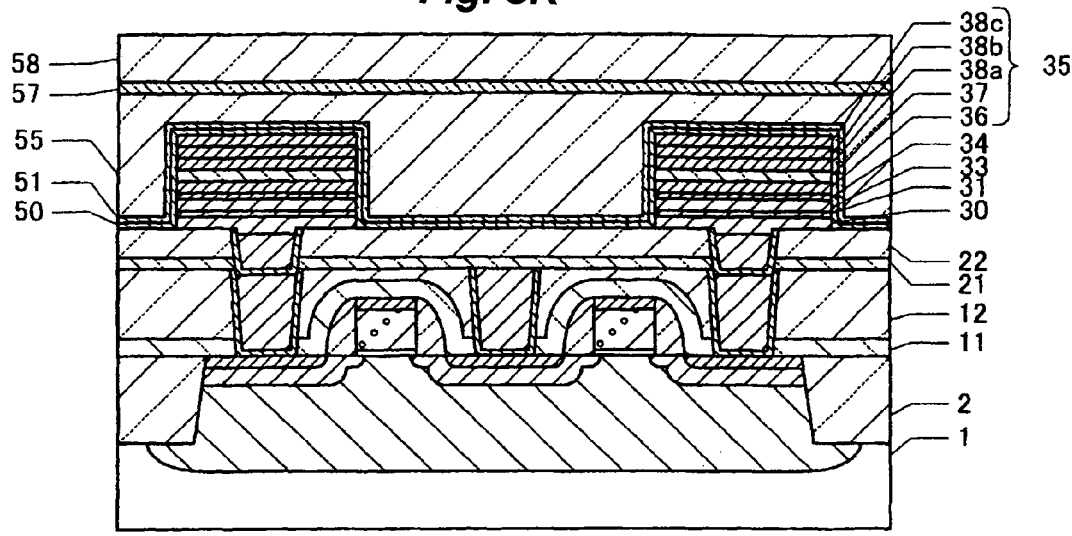
Figure 3S:
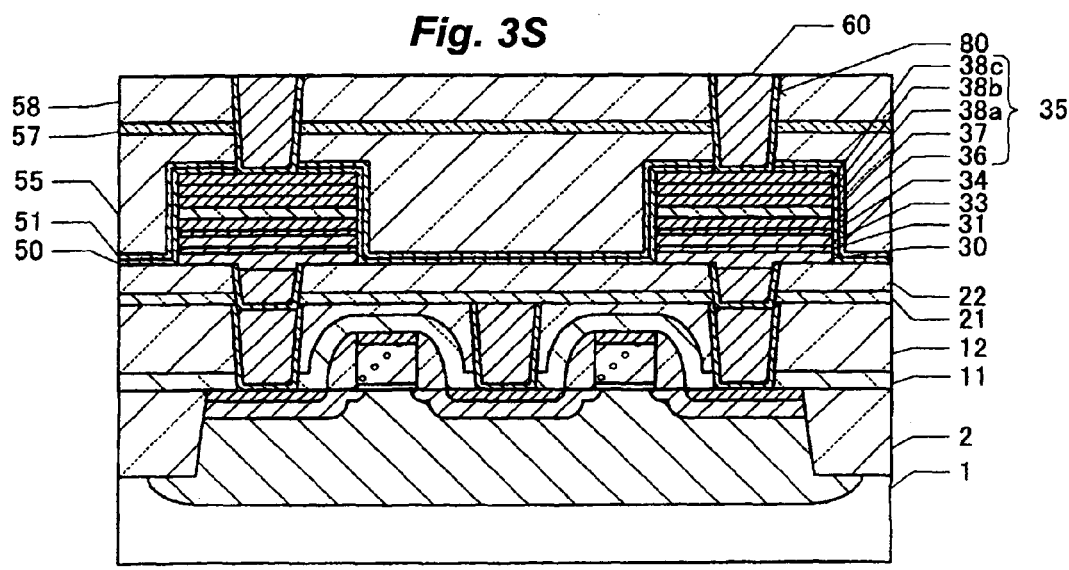
Figure 3T:
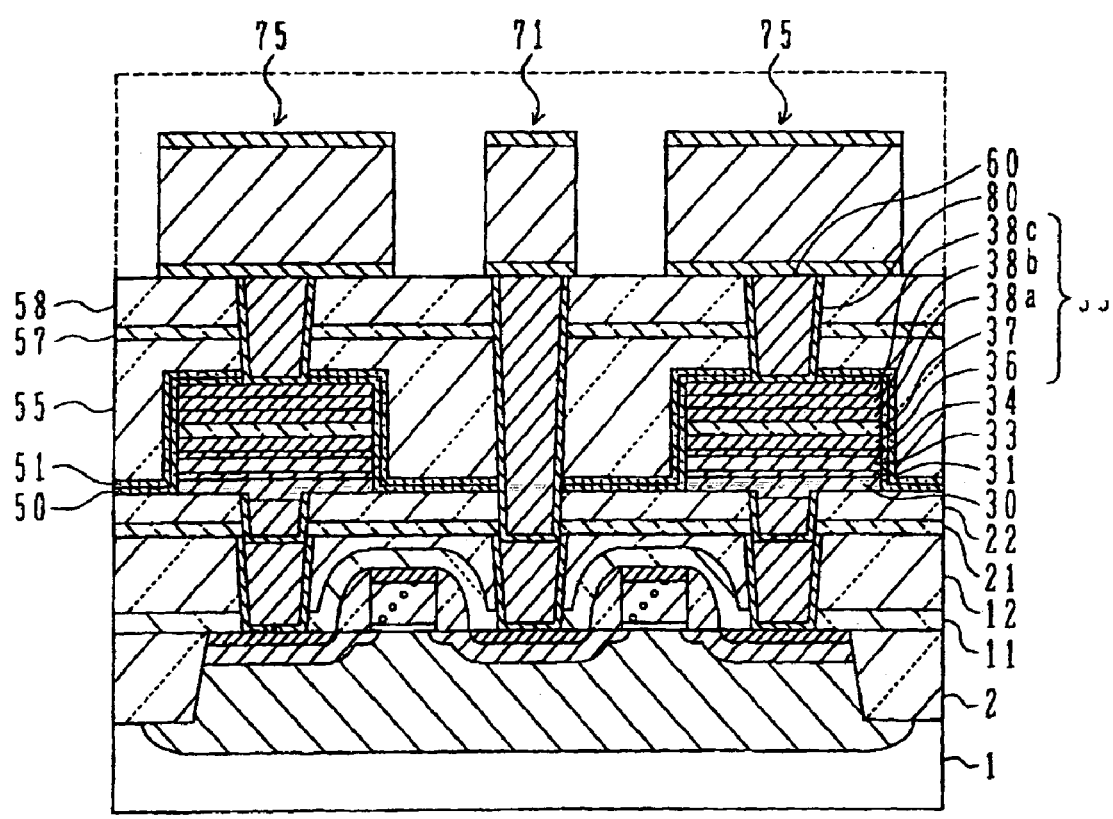

With reference to FIGS. 3A to 3T, description will be made on a stack type FeRAM manufacture method according to the second embodiment of the present invention.

As shown in FIG. 3A, an isolation trench is formed in a surface layer of a substrate 1 of n- or p-type silicon. After the trench surface is oxidized, a silicon oxide film is buried, for example, by high density plasma (HDP) CVD, and unnecessary regions are removed by CMP to form an isolation region 2 by shallow trench isolation (STI) and define active regions. The isolation region may be formed by LOCOS instead of STI. A p-type well 3 is formed by implanting p-type impurity ions into a surface layer of the active region.

A common source region of two MOS transistors is connected to a bit line, and a capacitor is connected to each drain to form two memory cells. This interconnect arrangement is widely used in DRAM. The embodiment also adopts this interconnect arrangement. Two MOS transistors 5 are formed in the active region. Brief description will now be made on a method of forming the MOS transistor 5.

A surface layer of the active region is thermally oxidized to form a $SiO_2$ film as a gate insulating film. A silicon film of amorphous silicon or polysilicon is formed on the substrate and patterned to form a gate electrode 5G. Two gate electrodes traverse one active region generally in parallel.

By using the gate electrode 5G as a mask, n-type impurity ions are implanted to form extension regions of a source region 5S and a drain region 5D. Sidewall spacers of silicon oxide or the like are formed on the sidewalls of the gate electrode 5G. By using the gate electrode 5G and sidewall spacers as a mask, n-type impurity ions are implanted to form deep and high concentration regions of the source region 5S and drain region 5D. With these processes, the MOS transistor 5 is formed.

Next, a film of refractory metal such as cobalt (Co) is formed on the substrate by sputtering. Heat treatment is performed to react the refractory metal film with silicon to form a refractory metal silicide layer on the upper surfaces of the gate electrode 5G, source region 5S and drain region 5D. Thereafter, unreacted refractory metal films are removed, and heat treatment is performed when necessary to form silicide films 6.

A cover insulating film 11 of SiON having a thickness of 200 nm is formed on the substrate by plasma CVD, covering the MOS transistors 5. An interlevel insulating film 12 of $SiO_2$ having a thickness of 1000 nm is formed on the cover insulating film 11. For example, the interlevel insulating film 12 is formed by plasma CVD using oxygen ($O_2$) and tetraethoxysilane (TEOS). Thereafter, the surface of the interlevel insulating film 12 is planarized by chemical mechanical polishing (CMP). CMP is controlled so that the interlevel insulating film on the flat surface of the substrate has a thickness of about 700 nm after planarization.

Via holes are formed through the interlevel insulating film 12 and cover insulating film 11, reaching the silicide film 6 on the drain region 5D and the silicide film 6 on the source region 5S. The via hole has a diameter of, e.g., 0.25 μm.

The inner surfaces of the via holes and an upper surface of the interlevel insulating film 12 are covered with two layers, a Ti film having a thickness of 30 nm and a TiN film having a thickness of 20 nm. A W film is formed on the two layers until the insides of the via holes are buried completely. A thickness of the W film is set to, e.g., 300 nm. Unnecessary W film, TiN film and Ti film are removed by CMP. A tight adhesion layer constituted of the Ti films, TiN films and conductive plugs 15 and 16 made of the W film are therefore left in the via holes. The conductive plugs 15 and 16 are connected to the drain region 5D and source region 5S, respectively.

As shown in FIG. 3B, an oxidation preventive film 21 of SiON having a thickness of 130 nm is formed on the interlevel insulating film 12 by plasma CVD. Instead of SiON, the oxidation preventive film 21 may be made of SiN or AlO. An interlevel insulating film 22 of $SiO_2$ having a thickness of 300 nm is formed on the oxidation preventive film by plasma CVD using $O_2$ and TEOS.

As shown in FIG. 3C, via holes are formed through the interlevel insulating film 22 and oxidation preventive film 21 to expose the underlying conductive plugs 15. The inner surface of the via hole is covered with a tight adhesion layer and W is buried in the via hole to form conductive plugs 25. This conductive plug 25 is formed by similar method as that used for the underlying conductive plug 15. Instead of the W plug, a polysilicon plug may also be used.

CMP for removing unnecessary W film and tight adhesion film is performed under the conditions that a polishing speed of the W film and tight adhesion film is faster than that of the interlevel insulating film 22. For example, SSW2000 manufactured by Cabot Microelectronics Corporation is used as slurry. Slight over-polishing is performed so as not to leave the tight adhesion film and W film on the interlevel insulating film 22. Therefore, the upper surface of the conductive plug 25 becomes lower than the upper surface of the surrounding interlevel insulating film 22 to form a depression 25a. A depth of the depression 25a is, e.g., 20 nm to 50 nm, typically about 50 nm.

After CMP, the upper surface of the interlevel insulating film 22 and the upper surfaces of the conductive plugs 25 are exposed to plasma of ammonium ($NH_3$). This plasma process is executed, for example, under the following conditions by using a parallel plate plasma processing system.

Distance between a substrate surface and an opposing electrode: about 9 mm (350 mils);
Pressure: 266 Pa (2 Torr);
Substrate temperature: 400° C.;
$NH_3$ gas flow rate: 350 sccm;
RF power of 13.56 MHz supplied to a substrate side electrode: 100 W;
RF power of 350 kHz supplied to the opposing electrode: 55 W;
Process time: 60 seconds.

With this $NH_3$ plasma process, NH radicals are coupled to oxygen atoms on the surface of the silicon oxide film.

As shown in FIG. 3D, a Ti film having a thickness of 100 nm is formed on the surface subjected to the plasma process, by DC sputtering. For example, the sputtering conditions are as in the following.

Target: Ti;
Distance between a substrate and a target: 60 mm;
Ar gas pressure: 0.15 Pa;
Substrate temperature: 20° C.;
Sputter power: 2.6 kW;
Film forming time: 35 seconds.

Since NH radicals are coupled to oxygen atoms on the surface of the silicon oxide film, Ti atoms attached to the surface can freely migrate on the surface without being captured by oxygen atoms. A Ti film having a hexagonal closest packing structure and a self-organized (0 0 2) orientation is formed on the surface of the interlevel insulating film. In this sense, the silicon oxide film modified with NH radicals can be said as a crystallinity improving film.

Next, rapid thermal annealing (RTA) is performed in a nitrogen atmosphere. For example, the RTA conditions are as in the following.

Annealing temperature: 650° C.;
Process time: 60 seconds.

With this annealing, the Ti film is nitridized and an underlying conductive film 30 can be formed having a face centered cubic lattice structure and made of (1 1 1) oriented TiO. A thickness of the underlying conductive film 30 may be set in a range of 100 nm to 300 nm. At this stage, a depression is formed on the surface of the underlying conductive film 30 above the conductive plug 25, by reflecting the depression 25a on the underlying surface. The surface of the underlying conductive film 30 is planarized by CMP. For example, SSW2000 manufactured by Cabot Microelectronics Corporation is used as slurry. A thickness of the underlying conductive film 30 after CMP is 50 nm to 100 nm, typically about 50 nm.

Crystals near the surface of the underlying conductive layer subjected to CMP have strain caused by polishing. If the lower electrode of a ferroelectric capacitor is formed on this underlying conductive layer, strain of the underlying conductive layer is transferred to the lower electrode, crystallinity of the lower electrode and further the upper ferroelectric film is adversely affected. In order to avoid this, after CMP, the surface of the planarized underlying conductive film 30 is exposed to $NH_3$ plasma. Crystal strain formed in a surface layer of the underlying conductive film 30 can therefore be recovered.

As shown in FIG. 3E, a Ti film having a thickness of 20 nm is formed by sputtering on the underlying conductive film 30 whose crystal strain was recovered by $NH_3$ plasma. This Ti film is a crystalline conductive film functioning as a tight adhesion film. RTA is performed in a nitrogen atmosphere. For example, the RTA conditions are as in the following.

Annealing temperature: 650° C.;
Process time: 60 seconds.

With this annealing, the Ti film is nitridized and an crystallinity improved film 31 can be formed having a face centered cubic lattice structure and made of (1 1 1) oriented TiN.

As shown in FIG. 3F, an oxygen barrier film 33 of TiAlN having a thickness of 100 nm is formed on the crystallinity improved film 31 by reactive sputtering using a TiAl alloy target. For example, the sputtering conditions are as in the following.

Ar gas flow rate: 40 sccm;
$N_2$ gas slow rate: 10 sccm;
Pressure: 253.3 Pa;
Substrate temperature: 400° C.;
Sputter power: 1.0 kW.

A lower electrode 36 of Ir having a thickness of 100 nm is formed on the oxygen barrier film 33 by sputtering. For example, the sputtering conditions are as in the following.

Ar atmosphere pressure: 0.11 Pa;
Substrate temperature: 500° C.;
Sputter power: 0.5 kW.

After the lower electrode 36 is formed, RTA heat treatment is performed in an Ar atmosphere at a temperature higher than a film forming temperature of the lower electrode 36. Specifically, RTA is performed under the following conditions.

Temperature: 650° C.;
Process time: 60 seconds.

With this heat treatment, crystallinity of the lower electrode can be improved. In-plane distribution of crystallinity can also be improved. With this heat treatment, a constituent element Al of the oxygen barrier film 33 reacts with a constituent element Ir of the upper electrode 36, and an intermediate layer 34 of IrAl alloy is formed at the interface therebetween. The intermediate layer 34 improves tight adhesion between the oxygen barrier film 33 and upper electrode 36. An atmosphere of the heat treatment may be other inert gas such as nitrogen and He, instead of Ar. The lower electrode may be made of platinum group metal such as Ir and Pt, conductive oxide such as PtO, $IrO_x$ and $SrRuO_3$ or a lamination of these films. If the lower electrode 36 is made of Pt or PtO, an intermediate layer 34 is formed which contains PtAl alloy. If the lower electrode 36 is made of $SrRuO_3$, an intermediate layer 34 is formed which contains RuAl alloy.

As shown in FIG. 3G, a ferroelectric film 37 of PZT is formed on the lower electrode 36 by metal organic chemical vapor deposition (MOCVD). Description will now be made on a method of forming the ferroelectric film 37.

As Pb source material, liquid source material having a concentration of 0.3 mol/l is used which is obtained by dissolving $Pb(C_{11}H_{19}O_2)_2$ [Pb(DPM)2] in tetrahydrofuran (THF). As Zr source material, liquid source material having a concentration of 0.3 mol/l is used which is obtained by dissolving $Zr(C_9H_{15}O_2)_4$ [Zr(dmh d)4] in THF. As Ti source material, liquid source material having a concentration of 0.3 mol/l is used which is obtained by dissolving $Ti(C_3H_7O)_2$ $(C_{11}H_{19}O_2)_2$ [Ti(O-iOr)2(DPM)2] in THF. These liquid source materials together with THF solvent of 0.474 ml/min is supplied to a vaporizer of a MOCVD system. Flow rates of Pb source material, Zr source material and Ti source material are 0.326 ml/min, 0.200 ml/min and 0.200 ml/min, respectively.

The substrate on which the ferroelectric film 37 is formed is loaded in a chamber of the MOCVD system. A pressure in the chamber is set to 665 Pa (5 Torr) and a substrate temperature is set to 620° C. Vaporized source material gasses are supplied to the inside of the chamber, and film formation is performed for 620 seconds. A PZT film having a thickness of 100 nm is therefore formed.

Next, a second PZT film in an amorphous phase is formed by sputtering to a thickness of 1 nm to 30 nm, typically 20 nm. By locating the PZT film in the amorphous phase, leak current can be reduced. An amorphous ferroelectric film may be formed by MOCVD.

As shown in FIG. 3H, an upper electrode 38 is formed on the ferroelectric film 37 under the same conditions as those of the first embodiment, the upper electrode having a three-layer structure constituted of a first conductive oxide film 38a, a second conductive oxide film 38b and a third conductive oxide film 38c. For example, by using the process similar to the first embodiment, an $IrO_x$ film is formed by reactive sputtering to a thickness of 20 nm to 70 nm, in the crystallization state when the film is formed, the $IrO_x$ film having an oxygen composition x lower than the stoichiometric composition (x=2).

After the first conductive oxide film 38a is formed, RTA is performed under the following conditions.

Process temperature: 725° C.;
Atmosphere: $O_2$ flow rate 20 sccm+Ar flow rate 2000 sccm;
Process time: 60 seconds.

With this heat treatment, the ferroelectric film 37 is crystallized perfectly, and at the same time, damages can be recovered which were caused by exposure of the PZT film 37 to plasma when the first conductive oxide film 38a was formed, and oxygen vacancies in the PZT film can be compensated.

Formed on the first conductive oxide film 38a by processes similar to those of the first embodiment are a second conductive oxide film ($IrO_y$ film) 38b having a thickness of 30 nm to 100 nm and a third conductive oxide film ($IrO_z$ film) 38c having a thickness of 50 nm to 150 nm. An oxygen composition y of the second conductive oxide film is set to a value near the stoichiometric composition (y=2), and an oxygen composition z of the third conductive oxide film is set to a value lower than y, so that the advantages similar to the first embodiment can be obtained.

As shown in FIG. 3I, a first hard mask 45 of TiN and a second hard mask 46 of $SiO_2$ are formed on the upper electrode 38. For example, the first hard mask 45 is formed by sputtering and the second hard mask 46 is formed by CVD using $O_2$ and TEOS.

As shown in FIG. 3J, the second hard mask 46 is patterned to have a plan shape of a ferroelectric capacitor to be formed. Next, by using the patterned second hard mask 46 as an etching mask, the first hard mask 45 is etched.

As shown in FIG. 3K, by using the second hard mask 46 and first hard mask 45 as an etching mask, the upper electrode 38, ferroelectric film 37 and lower electrode 36 (and intermediate layer 34) are etched. For example, this etching is performed by plasma etching using mixture gas of HBr, $O_2$, Ar and $C_4F_8$. A composition of the etching gas can be selected depending upon an etching target. The patterned lower electrode 36, ferroelectric film 37 and upper electrode 38 constitute a ferroelectric capacitor 35, During this etching, the surface layer of the second hard mask 46 is also etched.

As shown in FIG. 3L, the second hard mask 46 is removed by dry etching or wet etching. The first hard mask 45 is therefore exposed. The switching charge of the ferroelectric capacitor can be measured at this stage because the first hard mask 45 of TiN and oxygen barrier film 33 of TiAlN are conductive.

As shown in FIG. 3M, the oxygen barrier film 33, crystallinity improved film 31 and underlying conductive film 30 are etched in the area where the ferroelectric capacitor 35 is not disposed. For example, as etching gas, mixture gas of $CF_4$ gas of 5% at a flow rate ratio and $O_2$ gas of 95% is introduced into a down-flow type plasma etching chamber, and micro waves of 2.45 GHz are supplied to the upper electrode in the chamber at a high frequency power of 1400 W to perform dry etching. Alternatively, wet etching may be performed using mixture solution of $H_2O_2$, $NH_2OH$ and pure water as etchant liquid. In this case, the first hard mask 45 left on the upper electrode 38 is also removed and the upper electrode 38 is exposed.

As shown in FIG. 3N, a first protective film 50 of $Al_2O_3$ having a thickness of 20 nm is formed on the exposed surface by sputtering.

As shown in FIG. 3O, recovery annealing is performed in an oxygen atmosphere in a temperature range of 550° C. to 700° C. Damages of the ferroelectric film 37 can therefore be recovered. For example, if the ferroelectric film 37 is made of PZT, it is preferable to perform recovery annealing for 60 minutes at a temperature of 650° C.

As shown in FIG. 3P, a second protective film 51 of $Al_2O_3$ having a thickness of 20 nm is formed on the first protective film 50 by CVD, covering the ferroelectric capacitor.

As shown in FIG. 3Q, an interlevel insulating film 55 of $SiO_2$ having a thickness of 1500 nm is formed on the second protective film 51 by plasma CVD using $O_2$, TEOS and He. Thereafter, the surface of the interlevel insulating film 55 is planarized by CMP. The interlevel insulating film 55 may be made of other inorganic insulating material instead of $SiO_2$.

After planarization, heat treatment is performed in a plasma atmosphere of $N_2O$ gas or $N_2$ gas. This heat treatment removes moisture in the interlevel insulating film and changes the quality of the interlevel insulating film 55 so that moisture becomes hard to permeate into the interlevel insulating film 55.

Thereafter, a barrier film 57 of AlO having a thickness of 20 nm to 100 nm is formed on the interlevel insulating film 55 by sputtering or CVD. Since the underlying surface of the barrier film 57 is planarized, stable barrier performance can be retained more than the case wherein the barrier film is formed on an irregular surface.

As shown in FIG. 3R, an interlevel insulating film 58 of $SiO_2$ having a thickness of 800 nm to 1000 nm is formed on the barrier film 57 by plasma CVD using $O_2$, TEOS and He. The interlevel insulating film 58 may be made of SiON or SiN instead of $SiO_2$. The surface of the interlevel insulating film 58 is planarized by CMP.

As shown in FIG. 3S, via holes 80 are formed through five layers, from the interlevel insulating film 58 to the first protective film 50, reaching the upper electrodes 38 of the ferroelectric capacitors 35.

Heat treatment is performed at 550° C. in an oxygen atmosphere. Oxygen vacancies in the ferroelectric film 37 formed while the via hole 80 is formed can therefore be recovered.

A tight adhesion film of a Ti/TiN structure is formed on the inner surface of the via hole 80, and W or the like is buried in the inside of the via hole 80 to form a conductive plug 60. The tight adhesion film may be a two-layer structure of a Ti film formed by sputtering and a TiN film formed by MOCVD. After the TiN film is formed, a plasma process is executed using mixture gas of $N_2$ gas and $H_2$ gas to remove carbon in the TiN film. If the third upper electrode is made of Ir, it is possible to prevent the upper electrode 38 from being reduced, because the Ir film prevents invasion of hydrogen. Since the oxygen composition of $IrO_y$ of the second upper electrode 38b is set to a value near the stoichiometric composition, a catalyzer function of the upper electrode 38 relative to hydrogen is hard to present. The ferroelectric film 37 is therefore hard to be reduced by hydrogen radicals.

As shown in FIG. 3T, a via hole 85 is formed through seven layers, from the interlevel insulating film 58 to the oxidation preventive film 21, reaching the upper surface of the conductive plug 16. After a tight adhesion film of a Ti/TiN structure is formed covering the inner surface of the via hole 85, W or the like is buried in the inside of the via hole 85 to form a conductive plug 65.

Wirings 71 and 75 connected to the conductive plugs 60 and 65 are formed on the interlevel insulating film 58. First, sequentially formed are a Ti film having a thickness of 60 nm, a TiN film having a thickness of 30 nm, an AlCu alloy film having a thickness of 360 nm, a Ti film having a thickness of 5 nm and a TiN film having a thickness of 70 nm. The lamination structure constituted of these films is patterned to form the wirings 71 and 75. On this lamination structure, upper multilayer wirings of, e.g., second to fifth layers are formed.

Figure 4A:
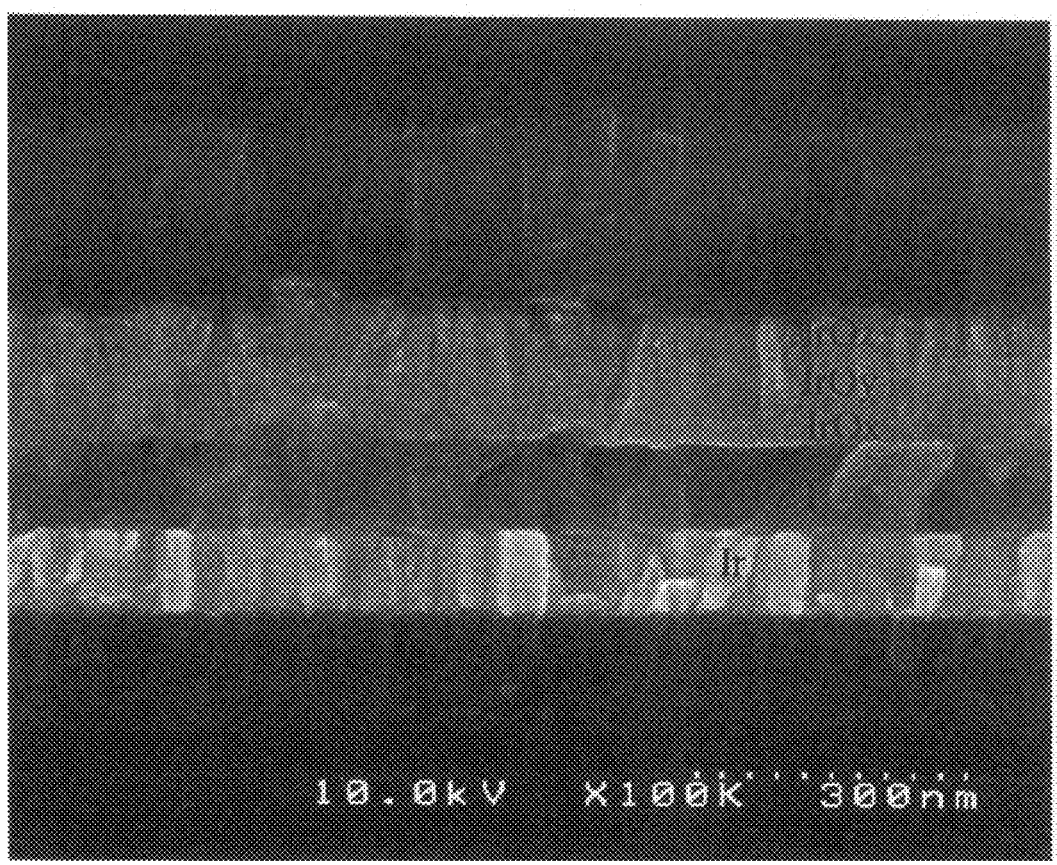
FIGS. 4A and 4B are a SEM photograph showing a cross sectional structure of a ferroelectric capacitor manufactured by the second embodiment method, and a cross sectional view schematically showing the structure.
Figure 4B:
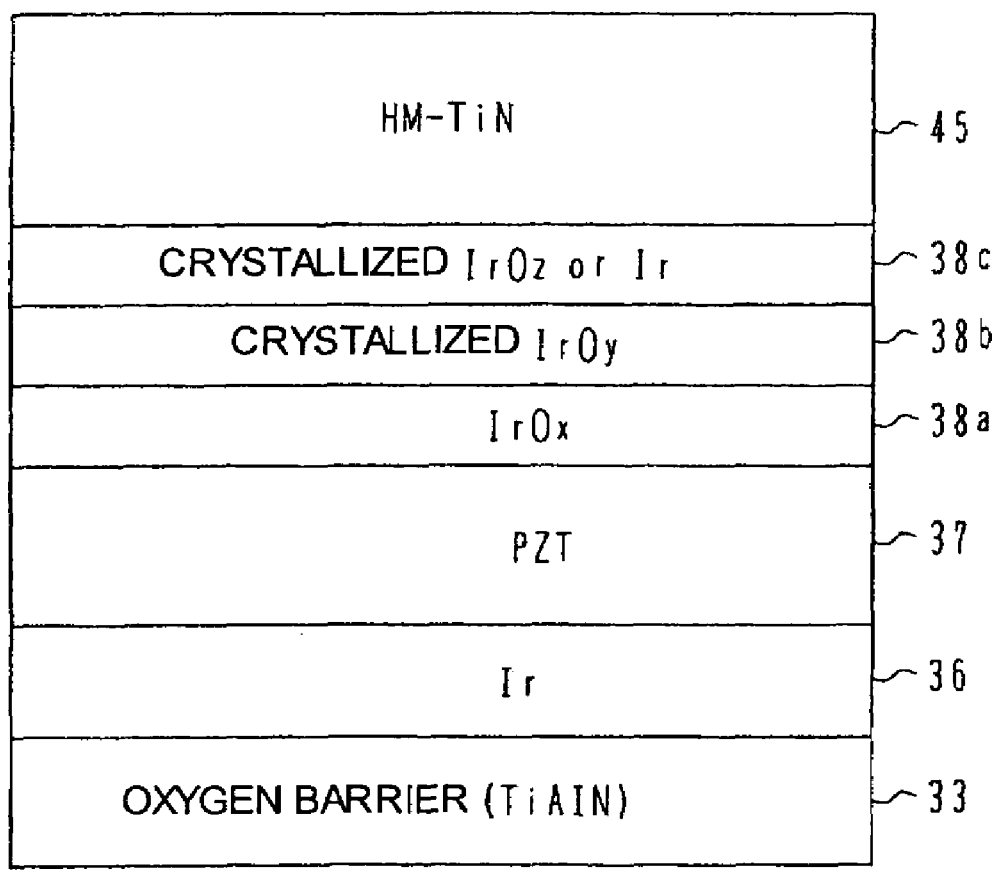

FIGS. 4A and 4B are a SEM photograph showing a cross sectional structure in the state that the TiN hard mask layer and silicon oxide hard mask layer are formed on the ferroelectric capacitor structure, and a schematic cross sectional view showing the cross sectional structure. A voids or defects structure having a large number of voids cannot be observed in the upper electrode. A clearly crystallized flat upper electrode can be obtained. Since the second and third upper electrodes are crystallized, it can be considered that the second and third upper electrodes are not affected and re-crystallization will not occur even if the hard mask layer is formed thereafter. Voids will not be formed in the second upper electrode.

A switching charge of a ferroelectric capacitor of a fine cell array (0.7 μm×0.7 μm) manufactured by the embodiment method was 30.5 μC/cm$^2$ after ferroelectric capacitors were etched, and 30.1 μC/cm$^2$ after five wiring layers were formed. Process deterioration did not occur.

Figure 5:
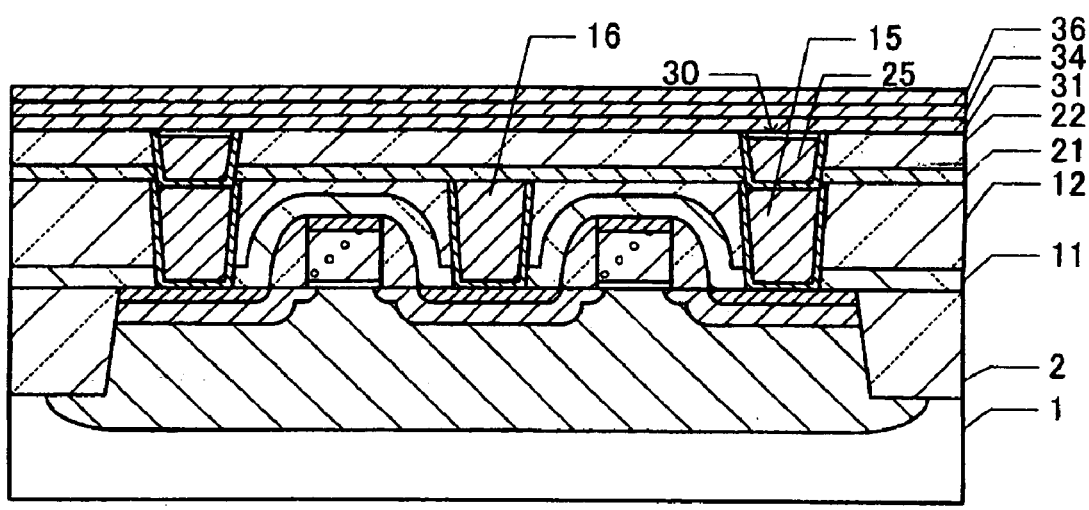
FIG. 5 is a cross sectional view of a semiconductor structure illustrating a third embodiment of the present invention.

With reference to FIG. 5, the third embodiment of the present invention will be described. Different points from the second embodiment will be described mainly. By the processes shown in FIGS. 3A to 3C, W plugs 25 are formed. With CMP, a recess 25a is formed on the upper surface of the plug 25. An NH$_3$ plasma process is executed similar to the second embodiment, and thereafter a Ti film is formed to a thickness of 100 nm. Heat treatment by RTA is performed in a N$_2$ atmosphere to nitridize the Ti film. In this way, a TiN underlying conductive film 30 is formed. The underlying conductive film 30 may be made of TiAlN, tungsten, silicon or copper not limiting only to TiN.

A depression is formed on the surface of the underlying conductive film 30 by reflecting the recess. If the upper structure is formed in this state, there is a fear of crystallinity deterioration of a ferroelectric film. Therefore, the upper surface of the underlying conductive film 30 is polished by CMP to planarize the surface and remove the depression, and the insulating film 22 is further polished. The upper surface of the insulating film 22 is made flush with the upper surface of the plug. On this flat surface, a Ti conductive tight adhesion film is formed and nitridized to form a TiN film 31. Thereafter, an oxygen barrier film 34 and a lower electrode 36 are formed. Further, RTA is performed at a temperature of 600° C. or higher in an inert gas. Processes similar to the second embodiment continue thereafter.

Figure 6:
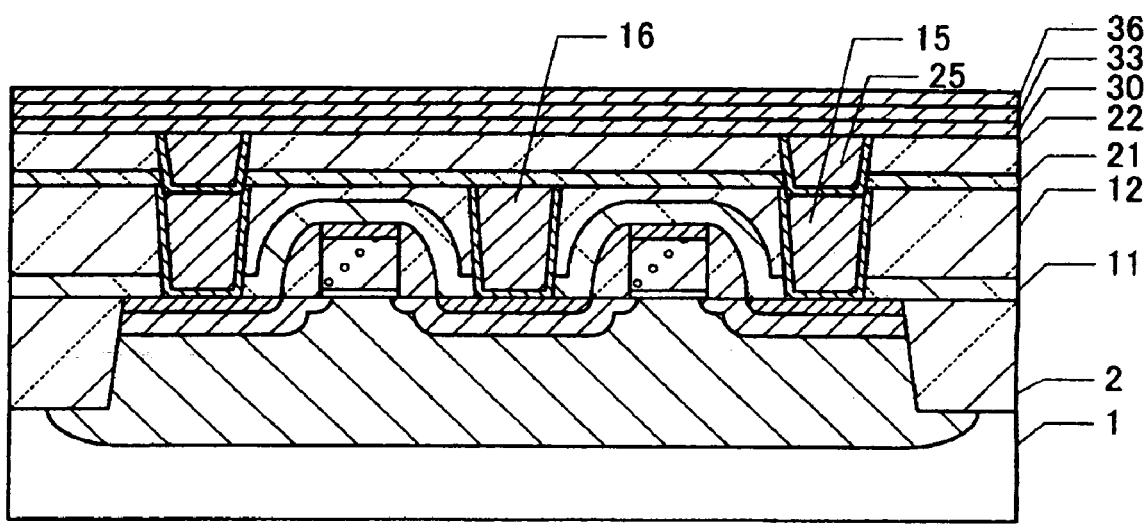
FIG. 6 is a cross sectional view of a semiconductor structure illustrating a fourth embodiment of the present invention.

With reference to FIG. 6, the fourth embodiment of the present invention will be described. Different points from the third embodiment will be described mainly. Elements up to the conductive plugs 25 are formed. In this case, CMP is performed by using a low pressure polishing system. No recesses are formed through polishing at a low pressure. Similar to the second embodiment, an NH$_3$ plasma process is executed to form a Ti film having a thickness of 20 nm. Heat treatment by RTA is performed in an N$_2$ atmosphere to nitridize the Ti film and form a TiN film 30. A TiAlN oxygen barrier film 33 and a lower electrode 36 are formed directly on the TiN film. Processes similar to the second embodiment are executed thereafter.

In addition to sputtering and MOCVD, the ferroelectric film may be formed by a sol-gel method, metal organic decomposition (MOD), chemical solution deposition (CSD), CVD, or epitaxial growth. As the ferroelectric film, a film may be used which changes a crystalline structure to a Bi-containing layer structure or a perovskite structure by heat treatment. In addition to the PZT film, such a film includes a film represented by a general formula of ABO$_3$ such as PZT, SBT, BLT, and Bi-containing layer compounds finely doped with La, Ca, Sr, Si or the like.

In forming the lowest layer of the upper electrode, reactive sputtering may be performed using a target including one or more of, e.g., platinum, iridium, ruthenium, rhodium, rhenium, osmium and palladium, under the condition that the metal of the platinum group is oxidized.

The present invention has been described in connection with the preferred embodiments. The invention is not limited only to the above embodiments. It will be apparent to those skilled in the art that other various modifications, improvements, combinations, and the like can be made.

What are claimed are:

1. A semiconductor device comprising:
   a semiconductor substrate;
   a MOS transistor comprising a gate electrode formed above said semiconductor substrate and current input/output regions formed in said semiconductor substrate on both sides of said gate electrode;
   a lower interlevel insulating film formed on the semiconductor substrate, covering said MOS transistor;
   a ferroelectric capacitor formed above said lower interlevel insulating film comprising:
   a capacitor lower electrode;
   an oxide ferroelectric film formed on said capacitor lower electrode;
   a first capacitor upper electrode formed on said oxide ferroelectric film and made of conductive oxide having a stoichiometric composition $AO_{x1}$ and an actual composition $AO_{x2}$;
   a second capacitor upper electrode formed on said first capacitor upper electrode and made of conductive oxide having a stoichiometric composition $BO_{y1}$ and an actual composition $BO_{y2}$, where y2/y1>x2/x1; and
   a third capacitor upper electrode formed on said second capacitor upper electrode and having a composition containing noble metal oxide of the platinum group; and
   a multilayer wiring structure formed above said lower interlevel insulating film, covering said ferroelectric capacitor and including interlevel insulating films and wirings
   wherein said third capacitor upper electrode is made of conductive oxide having a stoichiometric composition $CO_{z1}$ and an actual composition $CO_{z2}$, where y2/y1>z2/z1.

2. The semiconductor device according to claim 1, wherein A=B and x1=y1.

3. The semiconductor device according to claim 1, wherein C=B and z1=y1.

4. The semiconductor device according to claim 1, wherein said A, B, and C are ones selected from the group consisting from platinum, iridium, ruthenium, rhodium, rhenium, osmium and palladium.

5. The semiconductor device according to claim 4, further comprising:
- an upper interlevel insulating film formed on said lower interlevel insulating film, covering said ferroelectric cpacitor;
- a first via hole formed through said upper and lower interlevel insulating films, and exposing one of said current input/output regions of said MOS transistor;
- a conductive plug filling said first via hole;
- second via holes formed through said upper interlevel insulating film, and exposing said capacitor lower electrode and said third capacitor upper electrode; and
- local interconnects including one connecting said conductive plug and one of said capacitor lower electrode and said third capacitor upper electrode.

6. The semiconductor device according to claim 5, wherein said conductive plug is a W plug, and said local interconnect is made of aluminum or aluminum alloy.

7. The semiconductor device according to claim 4, further comprising:
- a first via hole formed through said lower interlevel insulating film, and exposing one of said current input/output regions of said MOS transistor;
- a conductive plug filling said first via hole; and
- an underlying conductive layer formed on said lower interlevel insulating film and said conductive plug, and having oxygen blocking function;
- wherein said capacitor lower electrode is formed above said underlying conductive layer.

8. The semiconductor device according to claim 7, further comprising an intermediate layer located between, and formed by reaction of said underlying conductive layer and said capacitor lower electrode.

* * * * *